(12) United States Patent
Nishijima

(10) Patent No.: US 9,105,353 B2
(45) Date of Patent: Aug. 11, 2015

(54) MEMORY DEVICE AND SEMICONDUCTOR DEVICE INCLUDING THE MEMORY DEVICE

(75) Inventor: Tatsuji Nishijima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 546 days.

(21) Appl. No.: 13/473,831

(22) Filed: May 17, 2012

(65) Prior Publication Data

US 2012/0294096 A1 Nov. 22, 2012

(30) Foreign Application Priority Data

May 20, 2011 (JP) ................................. 2011-113968

(51) Int. Cl.
*G11C 7/00* (2006.01)
*G11C 11/412* (2006.01)

(52) U.S. Cl.
CPC .................................... *G11C 11/412* (2013.01)

(58) Field of Classification Search
CPC .............. G11C 5/14; G11C 7/00; G11C 7/06; G11C 5/145; G11C 5/147; G11C 7/04; G11C 7/14
USPC .................. 365/149, 189.11, 189.08, 189.09, 365/189.16, 189.04, 230.05, 189.12, 230.08
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,278,637 B1 * | 8/2001 | Kawaguchi ............... 365/189.15 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,980,459 B2 | 12/2005 | Seshadri et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Hien Nguyen
(74) *Attorney, Agent, or Firm* — Husch Blackwell LLP

(57) ABSTRACT

A memory device includes a level shifter which includes a first input terminal, a second input terminal, a first output terminal configured to output a first signal, and a second output terminal configured to output an inverted signal of the first signal, a first buffer, a second buffer, a first node, and a second node. The first node, where an output terminal of the first buffer and the first input terminal of the level shifter are connected, is configured to hold a first data. The second node, where an output terminal of the second buffer and the second input terminal of the level shifter are connected, is configured to hold a second data.

20 Claims, 32 Drawing Sheets

(56) References Cited

U.S. PATENT DOCUMENTS

| | | | |
|---|---|---|---|
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0058692 | A1* | 3/2003 | Shiga ............... 365/189.09 |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0059683 | A1* | 3/2009 | Kang ................ 365/189.07 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0073078 | A1* | 3/2010 | Lee et al. ................ 327/536 |
| 2010/0092800 | A1 | 4/2010 | Itagaki et al. |
| 2010/0109002 | A1 | 5/2010 | Itagaki et al. |
| 2011/0063014 | A1 | 3/2011 | Koyama et al. |
| 2011/0101942 | A1 | 5/2011 | Yamazaki et al. |
| 2011/0242070 | A1 | 10/2011 | Yamazaki et al. |
| 2012/0327734 | A1* | 12/2012 | Sato ........................... 365/226 |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 5-251705 | 9/1993 |
| JP | 8-264794 | 10/1996 |
| JP | 11-505377 | 5/1999 |
| JP | 2000-44236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-146048 | 5/2004 |
| JP | 2004-273614 | 9/2004 |
| JP | 2004-273732 | 9/2004 |
| WO | WO 2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing a MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. pp. 64-68.

Kimizuka.N et al., "Spinel,YbFe2O4, andYb2Fe3O7 Types of Structures for Compounds in the In2O3 and Sc2O3—A2O3—BO Sys-

(56) References Cited

OTHER PUBLICATIONS tems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

● In
○ Sn
○ Zn
● O

FIG. 19A
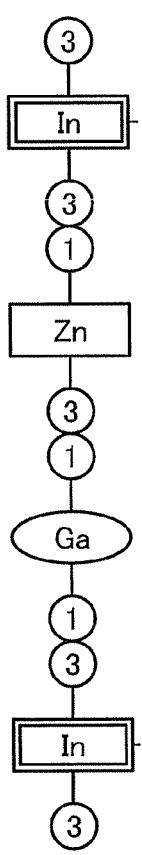
FIG. 19B
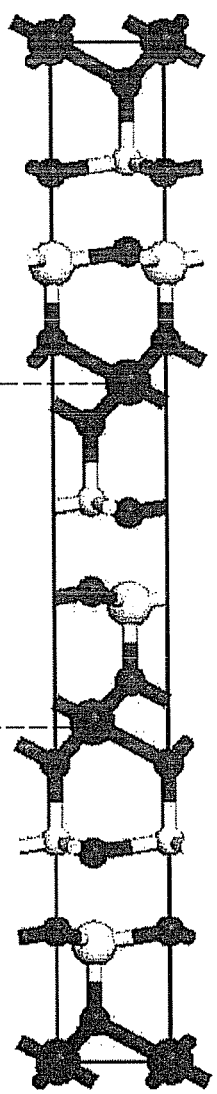
FIG. 19C
- In
- Ga
- Zn
- O

- In
- Ga or Zn
- O

- In
- Ga
- Zn
- O

MEMORY DEVICE AND SEMICONDUCTOR DEVICE INCLUDING THE MEMORY DEVICE

BACKGROUND OF THE INVENTION

1. Field of the Invention

The present invention relates to a nonvolatile memory device and a semiconductor device including the memory device.

2. Description of the Related Art

In a semiconductor device, a volatile memory such as a static random access memory (SRAM) is used for a memory portion where data is stored when high speed operation is needed. On the other hand, when data needs to be held while power is not supplied, a nonvolatile memory such as an electrically erasable programmable read-only memory (EEPROM) or a flash memory is used.

As a method for holding data certainly while power is not supplied, there is a backup method in which a volatile memory capable of high speed operation, such as an SRAM, is used while power is supplied to the semiconductor device and immediately before supplying power is stopped, data is written to a nonvolatile memory which operates at low speed.

As an SRAM which is non-volatized (also called nonvolatile SRAM) so as to store data even when the power supply of the SRAM which is a volatile memory is turned off, a nonvolatile memory in which a ferroelectric capacitor is provided in a memory cell has been actively researched and developed (see Patent Document 1).

REFERENCE

[Patent Document 1] Japanese Published Patent Application No. 2004-146048

SUMMARY OF THE INVENTION

The backup method has a problem in that in the case where a lot of volatile memories hold data, power consumed before stop of supplying power and after resumption of supplying power is increased because it takes a long time to make a backup of data.

On the other hand, a memory device in which a nonvolatile memory element including a ferroelectric capacitor or the like is provided in a memory cell has problems such as high manufacturing cost and low writing speed.

Thus, an object of one embodiment of the present invention is to provide a memory device which can operate at high speed and consume less power and a semiconductor device including the memory device.

One embodiment of the present invention includes: a level shifter which includes a first input terminal, a second input terminal to which an inverted signal of an input signal input to the first input terminal is input, a first output terminal from which the first signal is output, and a second output terminal from which an inverted signal of the first signal is output; a first buffer which includes a third input terminal to which the first signal is input, a fourth input terminal to which the inverted signal of the first signal is input, and a third output terminal; and a second buffer which includes a fifth input terminal to which the inverted signal of the first signal is input, a sixth input terminal to which the first signal is input, and a fourth output terminal. A signal output from the third output terminal of the first buffer is input to the first input terminal of the level shifter, and a signal output from the fourth output terminal of the second buffer is input to the second input terminal of the level shifter.

Note that first data is held in a first node where the third output terminal of the first buffer and the first input terminal of the level shifter are connected, and second data is held in a second node where the fourth output terminal of the second buffer and the second input terminal of the level shifter are connected. In each of the first buffer and the second buffer, transistors in each of which a channel region is formed in an oxide semiconductor film are connected in series.

One embodiment of the present invention is a memory element including: a first buffer which includes a first transistor and a second transistor connected in series; a second buffer which includes a third transistor and a fourth transistor connected in series; a level shifter which includes a fifth transistor and a sixth transistor connected in series and a seventh transistor and an eighth transistor connected in series; a first node where a gate of the sixth transistor is connected to a connection portion of one of a source and a drain of the third transistor and one of a source and a drain of the fourth transistor; and a second node where a gate of the eighth transistor is connected to a connection portion of one of a source and a drain of the first transistor and a connection portion of one of a source and a drain of the second transistor. In the memory element, a gate of the first transistor, a gate of the fourth transistor, a gate of the seventh transistor, and a connection portion of one of a source and a drain of the fifth transistor and one of a source and a drain of the sixth transistor are connected to a first terminal; a gate of the second transistor, a gate of the third transistor, a gate of the fifth transistor, and a connection portion of one of a source and a drain of the seventh transistor and one of a source and a drain of the eighth transistor are connected to a second terminal; and data is held in the first node and the second node.

Each of the first to fourth transistors is a transistor in which a channel region is formed in an oxide semiconductor film, the fifth transistor and the seventh transistor are p-channel transistors, and the sixth transistor and the eighth transistor are n-channel transistors.

Another embodiment of the present invention is a memory element including: a first buffer which includes a first transistor and a second transistor connected in series; a second buffer which includes a third transistor and a fourth transistor connected in series; and a level shifter which includes a fifth transistor, a sixth transistor, and a seventh transistor connected in series, and an eighth transistor, a ninth transistor, and a tenth transistors connected in series. In the memory element, a gate of the first transistor, a gate of the fourth transistor, a gate of the eighth transistor, and a connection portion of one of a source and a drain of the sixth transistor and one of a source and a drain of the seventh transistor are connected to a first terminal; a gate of the second transistor, a gate of the third transistor, a gate of the fifth transistor, and a connection portion of one of a source and a drain of the ninth transistor and one of a source and a drain of the tenth transistor are connected to a second terminal; and data is held in a first node where a gate of the sixth transistor and a gate of the seventh transistor are connected to a connection portion of one of a source and a drain of the third transistor and one of a source and a drain of the fourth transistor and a second node where a gate of the ninth transistor and a gate of the tenth transistor are connected to a connection portion of one of a source and a drain of the first transistor and one of a source and a drain of the second transistor.

In the above memory element, data is held in a node where an output terminal (one of the source and the drain of the transistor) of the buffer and an input terminal (the gate of the transistor) of the level shifter are connected. The buffer is formed using a transistor which includes a channel region in an oxide semiconductor film and has an extremely small amount of leakage current. Thus, even after supply of the power supply voltage is stopped, the voltage of the node can be held for a long time. That is, the memory element is a nonvolatile memory element.

Further, even when the potential of the node fluctuates due to the long stop of supplying power, the potential of the node is easily refreshed; thus, malfunction of data holding can be reduced.

Further, in the case where power starts to be supplied after the stop of supplying power, the backup of data in the memory device is not needed. Therefore, immediate power shutdown and restoring data at high speed after start of supplying power are possible in a semiconductor device, and accordingly power consumption can be, reduced.

Further, in a memory device including a plurality of memory elements each of which is the above memory element, supplying power to a memory element to/from which data is not written/read can be selectively stopped. Thus, power consumption of a semiconductor device can be reduced.

A memory element includes a transistor with a channel region formed in an oxide semiconductor film and a transistor which includes a semiconductor substrate or a semiconductor film provided over an insulating substrate and is connected to the transistor with an oxide semiconductor film. The transistor with a channel region formed in an oxide semiconductor film can be stacked over the transistor with a semiconductor substrate or a semiconductor film provided over an insulating substrate, and as a result, high integration of the semiconductor device is achieved.

According to one embodiment of the present invention, a memory element includes a level shifter and a buffer in which transistors each including a channel region formed in an oxide semiconductor film are connected in series; thus, data can be held in the memory element even when power is not supplied. Therefore, the starting time can be shortened and the power consumption can be reduced. Further, in the memory element, the level shifter is formed using a transistor which includes a semiconductor substrate or a semiconductor film provided over an insulating substrate, and over the level shifter, the buffer is formed using a transistor in which a channel region is formed in an oxide semiconductor film. In other words, the level shifter and the buffer can be stacked, which enables high integration.

BRIEF DESCRIPTION OF THE DRAWINGS

FIGS. 19A to 19C are diagrams illustrating a crystal structure of an oxide material according to one embodiment of the present invention.

DETAILED DESCRIPTION OF THE INVENTION

Figure 1:
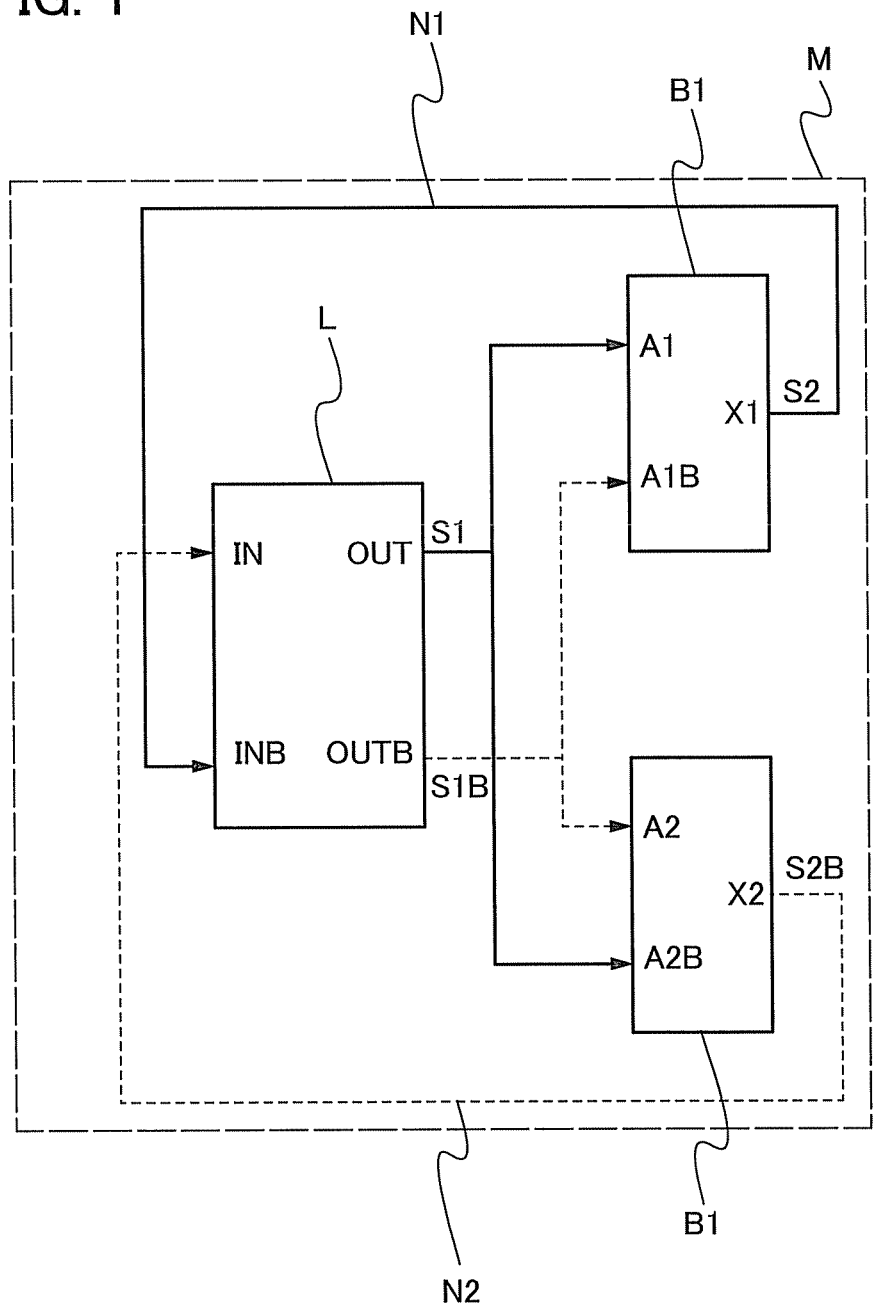
FIG. 1 is a block diagram showing a memory element according to one embodiment of the present invention.

Embodiments of the present invention will be described below with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the following description.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on the object having any electric function as long as electric signals can be transmitted and received between the components connected through the object.

In addition, even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

One embodiment of a memory element included in a memory device will be described with reference to FIG. 1, FIG. 2, and FIG. 3.

FIG. 1 is a block diagram showing a memory element described in this embodiment.

A memory element M described in this embodiment includes a level shifter L, a buffer B1, and a buffer B2.

The level shifter L includes a first input terminal IN, a second input terminal INB, a first output terminal OUT, and a second output terminal OUTB. To the second input terminal INB, an inverted signal of a signal input to the first input terminal IN is input. From the first output terminal OUT, a signal S1 is output. From the second output terminal OUTB, an inverted signal S1B that is an inverted signal of the signal S1 output from the first output terminal OUT is output.

The buffer B2 includes a first input terminal A2, a second input terminal A2B, and an output terminal X2. To the second input terminal A2B, the signal S1 output from the first output terminal OUT of the level shifter L is input. To the first input terminal A2, the inverted signal S1B that is an inverted signal of the signal S1 and output from the second output terminal OUTB of the level shifter L is input. From the output terminal X2, a signal S2 is output, and the signal S2 is input to the first input terminal INB of the level shifter L. Note that the signal S1 and the signal S2 have different logical values from each other (e.g., when the potential of the signal S1 is High (or the potential corresponding to "1"), the potential of the signal S2 is Low (or the potential corresponding to "0")).

The buffer B1 includes a first input terminal A1, a second input terminal A1B, and an output terminal X1. To the second input terminal A1B, the inverted signal S1B that is an inverted signal of the signal S1 and output from the second output terminal OUTB of the level shifter L is input. To the first input terminal A1, the signal S1 output from the first output terminal OUT of the level shifter L is input. From the output terminal X1, an inverted signal S2B that is an inverted signal of the signal S2 is output, and the inverted signal S2B is input to the second input terminal IN of the level shifter L. Note that the inverted signal S1B and the inverted signal S2B also have different logical values from each other. Note that although not illustrated, the first input terminal A1 of the buffer B1, the second input terminal A2B of the buffer B2, and the first output terminal OUT of the level shifter L are connected to a first terminal D shown in FIG. 2. Further, although not illustrated, the second input terminal A1B of the buffer B1, the first input terminal A2 of the buffer B2, and the second output terminal OUTB of the level shifter L are connected to a second terminal DB shown in FIG. 2.

In each of the buffer B1 and the buffer B2, n-channel transistors with an extremely small amount of off-state current are connected in series, and the output terminal (X1 and X2) is formed at a connection portion of one of a source and a drain of one of the n-channel transistors and one of a source and a drain of another n-channel transistor. The transistor with a small amount of off-state current is a transistor in which a channel region is formed using a semiconductor film with a wide energy gap (e.g., 2 eV or more, preferably 2.5 eV or more, further preferably 3 eV or more). Typically, a transistor in which a channel region is formed using an oxide semiconductor film, silicon carbide, gallium nitride, or the like can be given as an example.

In the memory element M described in this embodiment, first data is held by adjusting a potential (or the amount of charge corresponding to the potential) at a connection portion (node N1) of the output terminal X1 of the buffer B1 and the second input terminal INB of the level shifter L in accordance with data. In addition, second data that is inverted data of the first data is held by adjusting a potential (or the amount of charge corresponding to the potential) at a connection portion (node N2) of the output terminal. X2 of the buffer B2 and the first input terminal IN of the level shifter L in accordance with data. For example, 1-bit data can be stored when a state in which a predetermined potential is held in the node N2 corresponds to "1" and a state in which potential is not held at the node N1 corresponds to "0".

In each of the buffer B1 and the buffer B2, the transistors each of which includes a channel region formed in an oxide semiconductor film and has an extremely small off-state current are connected in series. Further, each of the output terminal X1 of the buffer B1 and the output terminal X2 of the buffer B2 is the connection portion of one of a source and a drain of one of the n-channel transistors with an extremely small amount of off-state current and one of a source and a drain of another n-channel transistor. At the connection portions, potentials of the input terminals of the level shifter L are controlled. Thus, even when power is not supplied, the first data and the second data can be held, and as a result, the memory element M functions as a nonvolatile memory element.

Further, the signals output from the level shifter L are input to the level shifter L via the buffer B1 and the buffer B2; the output data of the level shifter L is fed back accordingly. In other words, the memory element M functions as a nonvolatile latch. Even if the potentials held at the node N1 and the node N2 fluctuate due to the long stop of supplying power, the potentials of the node N1 and the node N2 can be refreshed when power is supplied, and thus change in data of the memory element can be reduced.

Next, a specific circuit configuration of the memory element M illustrated in FIG. 1 will be described with reference to FIG. 2 and FIG. 3.

Figure 2:
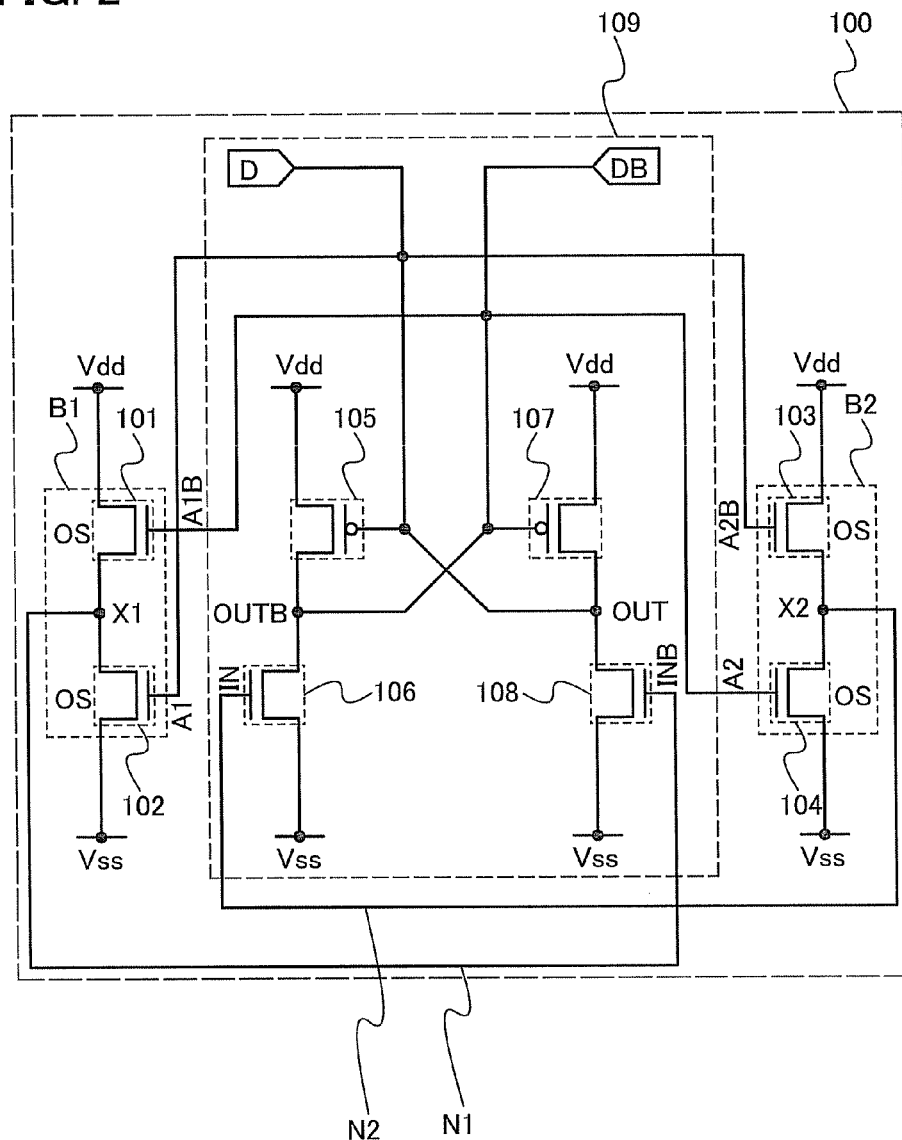
FIG. 2 is a circuit diagram showing a memory element according to one embodiment of the present invention.

FIG. 2 is a circuit diagram showing one mode of a memory element 100. The memory element 100 includes a buffer B1 in which a first transistor 101 and a second transistor 102 are connected in series, a buffer B2 in which a third transistor 103 and a fourth transistor 104 are connected in series, and a level shifter 109. The level shifter 109 includes a fifth transistor 105 and a sixth transistor 106 connected in series and a seventh transistor 107 and an eighth transistor 108 connected in series.

In the buffer B1, one of a source and a drain of the first transistor 101 and one of a source and a drain of the second transistor 102 are connected. This connection portion corresponds to the output terminal X1 of the buffer B1.

In the buffer B2, one of a source and a drain of the third transistor 103 and one of a source and a drain of the fourth transistor 104 are connected. This connection portion corresponds to the output terminal X2 of the buffer B2.

In the level shifter 109, one of a source and a drain of the fifth transistor 105 and one of a source and a drain of the sixth transistor 106 are connected. This connection portion corresponds to the second output terminal OUTB of the level shifter 109.

In the level shifter 109, one of a source and a drain of the seventh transistor 107 and one of a source and a drain of the eighth transistor 108 are connected. This connection portion corresponds to the first output terminal OUT of the level shifter 109.

The other of the source and the drain of each of the first transistor 101, the third transistor 103, the fifth transistor 105, and the seventh transistor 107 is connected to a wiring for supplying a high power supply potential $V_{dd}$.

The other of the source and the drain of each of the second transistor 102, the fourth transistor 104, the sixth transistor 106, and the eighth transistor 108 is connected to a wiring for supplying a low power supply potential $V_{ss}$.

A gate of the second transistor 102, a gate of the third transistor 103, a gate of the fifth transistor 105, and the connection portion of the one of a source and a drain of the seventh transistor 107 and the one of a source and a drain of the eighth transistor 108 are connected to the first terminal D. In other words, the first input terminal A1 of the buffer B1, the second input terminal A2B of the buffer B2, and the first output terminal OUT of the level shifter are connected to the first terminal D.

A gate of the first transistor 101, a gate of the fourth transistor 104, a gate of the seventh transistor 107, and the connection portion of the one of a source and a drain of the fifth transistor 105 and the one of a source and a drain of the sixth transistor 106 are connected to the second terminal DB. In other words, the second input terminal A1B of the buffer B1, the first input terminal A2 of the buffer B2, and the second output terminal OUTB of the level shifter are connected to the second terminal DB.

A signal input/output to/from the first terminal D corresponds to the signal S1 in FIG. 1. A signal input/output to/from the second terminal DB corresponds to the inverted signal SIB in FIG. 1. That is, the signal input to the second terminal DB is an inverted signal of the signal input to the first terminal D, and the signal output from the second terminal DB is an inverted signal of the signal output from the first terminal D. To the first terminal D and the second terminal DB, signals are input from an external device at the same time. Further, the signals are output from the first terminal D and the second terminal DB to the external device at the same time.

The connection portion of the one of a source and a drain of the first transistor 101 and the one of a source and a drain of the second transistor 102 is connected to a gate of the eighth transistor 108. Thus, the output terminal X1 of the buffer B1 and the second input terminal INB of the level shifter are connected. Note that the connection portion is denoted by the node N1.

The connection portion of the one of a source and a drain of the third transistor 103 and the one of a source and a drain of the fourth transistor 104 is connected to the gate of the sixth transistor 106. Thus, the output, terminal X2 of the buffer B2 and the first input terminal IN of the level shifter are connected. Note that the connection portion is denoted by the node N2.

The first transistor 101 to the fourth transistor 104 are n-channel transistors with a small amount of off-state current. The transistor with a small amount of off-state current is a transistor in which a channel region is formed using a semiconductor film with a wide energy gap (e.g., 2 eV or more, preferably 2.5 eV or more, further preferably 3 eV or more). Typically, a transistor in which a channel region is formed using an oxide semiconductor, silicon carbide, gallium nitride, or the like can be given as an example.

As an example of an n-channel transistor with a small amount of off-state current, a transistor in which a channel region is formed using an oxide semiconductor film is described here. Note that in FIG. 2 and FIG. 3, "OS" is written beside some transistors in order to indicate that the channel regions of the "OS" transistors are each formed using an oxide semiconductor film.

Further, the fifth transistor 105 and the seventh transistor 107 are p-channel transistors. The sixth transistor 106 and the eighth transistor 108 are n-channel transistors. The fifth transistor 105 to the eighth transistor 108 each include a semiconductor substrate described later or a semiconductor film provided over an insulating substrate.

Next, another mode of a memory element included in the memory device is described with reference to FIG. 3. In a memory element 110 described in this embodiment, some of transistors in a level shifter circuit form inverters, which is different from the level shifter in the memory element 100 illustrated in FIG. 2.

Figure 3:
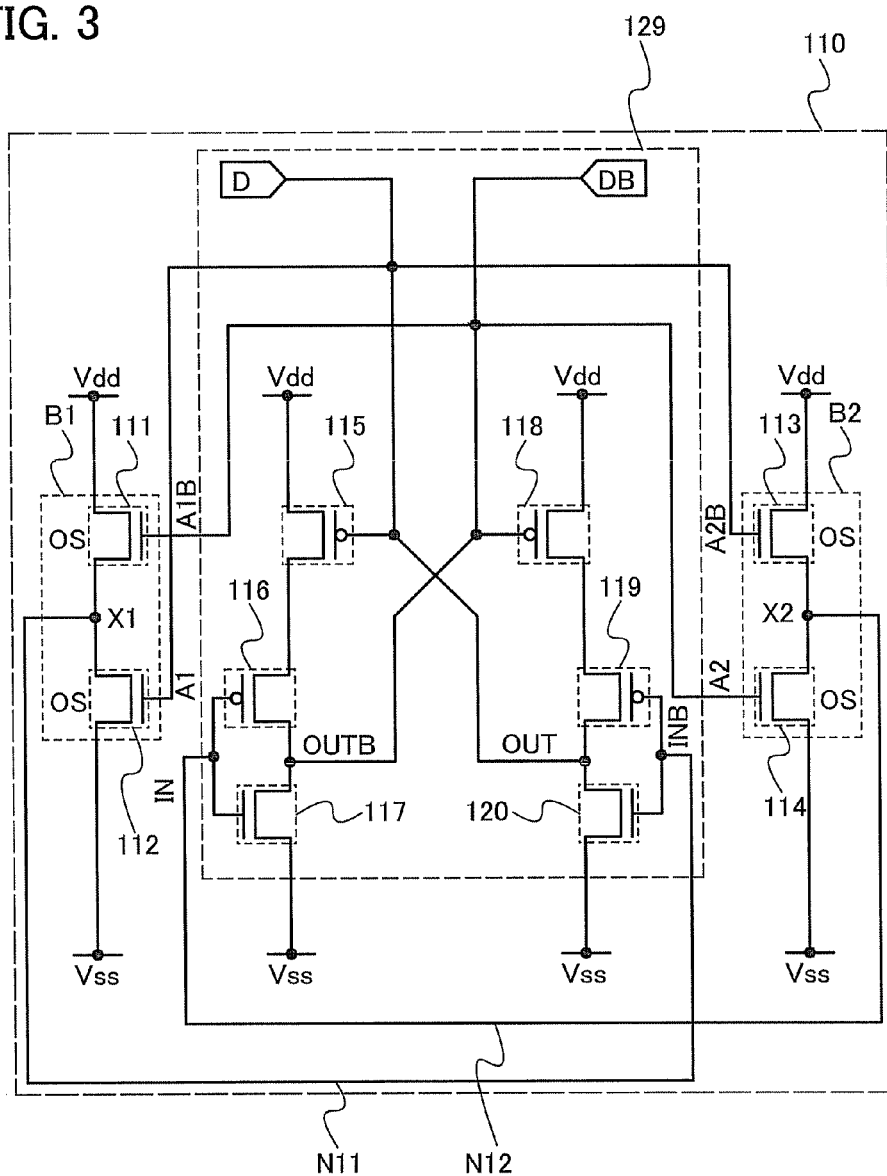
FIG. 3 is a circuit diagram showing a memory element according to one embodiment of the present invention.

FIG. 3 is a circuit diagram showing one mode of the memory element 110. The memory element 110 includes a buffer B1 in which a first transistor 111 and a second transistor 112 are connected in series, a buffer B2 in which a third transistor 113 and a fourth transistor 114 are connected in series, and a level shifter 129. The level shifter 129 includes a fifth transistor 115, a sixth transistor 116, and a seventh transistor 117 connected in series, and an eighth transistor 118, a ninth transistor 119, and a tenth transistor 120 connected in series.

In the buffer B1, one of a source and a drain of the first transistor 111 is connected to one of a source and a drain of the second transistor 112. This connection portion corresponds to the output terminal X1 of the buffer B1.

In the buffer B2, one of a source and a drain of the third transistor 113 is connected to one of a source and a drain of the fourth transistor 114. This connection portion corresponds to the output terminal X2 of the buffer B2.

In the level shifter 129, one of a source and a drain of the sixth transistor 116 is connected to one of a source and a drain of the seventh transistor 117. This connection portion corresponds to the second output terminal OUTB of the level shifter 129. Further, one of a source and a drain of the fifth transistor 115 is connected to the other of the source and the drain of the sixth transistor 116.

In the level shifter 129, one of a source and a drain of the ninth transistor 119 is connected to one of a source and a drain of the tenth transistor 120. This connection portion corresponds to the first output terminal OUT of the level shifter 129. Further, one of a source and a drain of the eighth transistor 118 is connected to the other of the source and the drain of the ninth transistor 119.

The other of the source and the drain of each of the first transistor 111, the third transistor 113, the fifth transistor 115, and the eighth transistor 118 is connected to a wiring for supplying a high power supply potential $V_{dd}$.

The other of the source and the drain of each of the second transistor 112, the fourth transistor 114, the seventh transistor 117, and the tenth transistor 120 is connected to a wiring for supplying a low power supply potential $V_{ss}$.

A gate of the second transistor 112, a gate of the third transistor 113, a gate of the fifth transistor 115, and the connection portion of the one of a source and a drain of the ninth transistor 119 and the one of a source and a drain of the tenth transistor 120 are connected to a first terminal D. In other words, the first input terminal A1 of the buffer B1, the second input terminal A2B of the buffer B2, and the first output terminal OUT of the level shifter are connected to the first terminal D.

A gate of the first transistor 111, a gate of the fourth transistor 114, a gate of the eighth transistor 118, and the connection portion of the one of a source and a drain of the sixth transistor 116 and the one of a source and a drain of the seventh transistor 117 are connected to the second terminal DB. In other words, the second input terminal A1B of the buffer B1, the first input terminal A2 of the buffer B2, and the second output terminal OUTB of the level shifter are connected to the second terminal DB.

Further, the connection portion of the one of a source and a drain of the first transistor 111 and the one of a source and a drain of the second transistor 112 is connected to gates of the ninth transistor 119 and the tenth transistor 120. Thus, the output terminal X1 of the buffer B1 and the second input terminal INB of the level shifter are connected to each other. Note that this connection portion is denoted by a node N11.

Further, the connection portion of the one of a source and a drain of the third transistor 113 and the one of a source and a drain of the fourth transistor 114 is connected to gates of the sixth transistor 116 and the seventh transistor 117. Thus, the output terminal X2 of the buffer B2 and the first input terminal IN of the level shifter are connected to each other. Note that this connection portion is denoted by a node N12.

The first transistor 111 to the fourth transistor 114 are n-channel transistors with a small amount of off-state current. The n-channel transistor with a small amount of off-state current is a transistor in which a channel region is formed using a semiconductor film with a wide energy gap (e.g., 2 eV or more, preferably 2.5 eV or more, further preferably 3 eV or more). Typically, a transistor in which a channel region is formed using an oxide semiconductor film, silicon carbide, gallium nitride, or the like can be given as an example.

The fifth transistor 115, the sixth transistor 116, the eighth transistor 118, and the ninth transistor 119 are p-channel transistors. The seventh transistor 117 and the tenth transistor 120 are n-channel transistors. With use of the sixth transistor 116 and the seventh transistor 117, the inverter is formed. With use of the ninth transistor 119 and the tenth transistor 120, the inverter is formed. The fifth transistor 115 to the tenth transistor 120 are each a transistor including a semiconductor substrate described later or a semiconductor film provided over an insulating substrate.

In each of the memory element 100 and the memory element 110 shown in FIG. 2 and FIG. 3, even when the potential of the node decreases due to the long stop of supplying power, the potential is increased by the level shifter and is output, so that the data of the node can be read out. Further, the data is fed back to the node, whereby the potential of the node can be refreshed.

Further, in the level shifter 129 of the memory element 110 shown in FIG. 3, the inverter is provided between the wiring for supplying a high power supply potential $V_{dd}$ and the wiring for supplying a low power supply potential $V_{ss}$; the through current from the wiring for supplying a high power supply potential $V_{dd}$ to the wiring for supplying a low power supply potential $V_{ss}$ can be reduced, and thus power consumption can be further reduced as compared with the case of the memory element in FIG. 2.

The refresh operation of the memory element described in this embodiment is described. As an example, the refresh operation of the memory element 100 shown in FIG. 2 is described with reference to FIG. 4 to FIG. 10.

Figure 4:
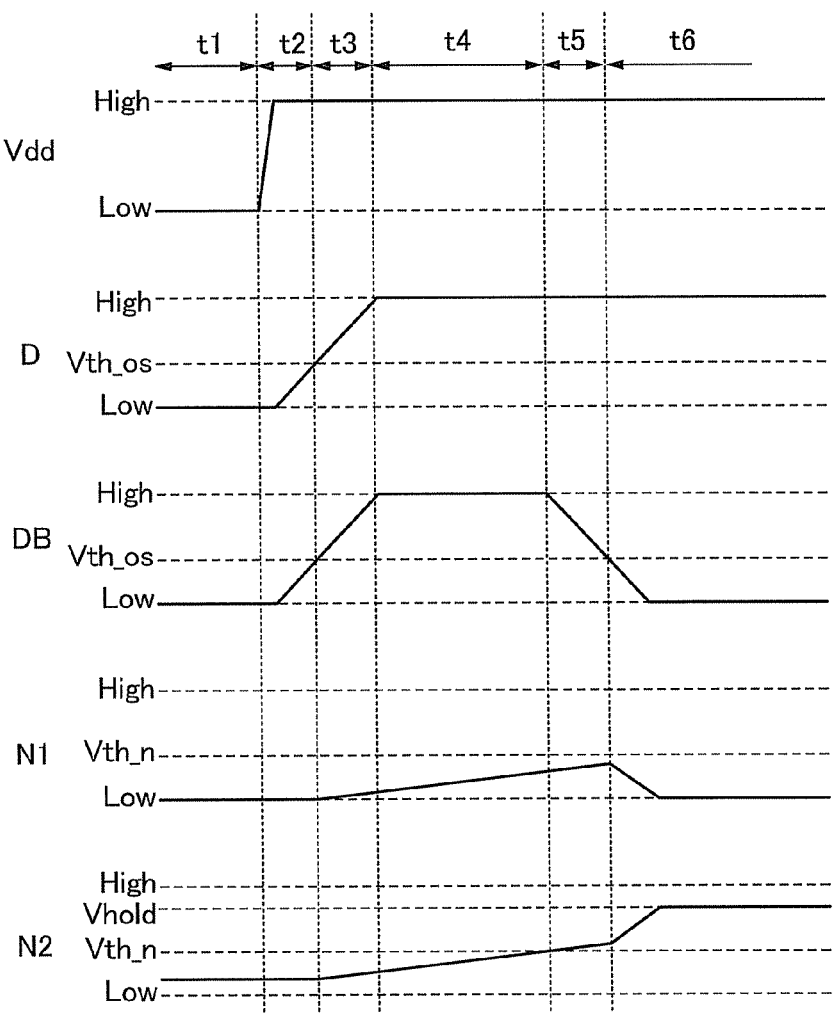
FIG. 4 is a timing chart showing operation of a memory element according to one embodiment of the present invention.

FIG. 4 is a timing chart in which solid lines indicate the high power supply potential $V_{dd}$ and the potentials of the first terminal D, the second terminal DB, the node N1, and the node N2 in the refresh operation performed after supplying power is stopped in the state where the potential Low (0 V) is applied to the node N1 and the potential $V_{hold}$ is applied to the node N2. FIG. 5 to FIG. 10 are circuit diagrams of the memory element in periods t1 to t6. In FIG. 5 to FIG. 10, cross marks are put on the transistors in an off state. Note that the potential $V_{hold}$ refers to a voltage that is lower than the high power supply potential $V_{dd}$ (High) by the threshold voltage of an n-channel transistor ($V_{th\_n}$), which satisfies the relation, Low<$V_{th\_n}$<$V_{hold}$<High.

<Power-Off State (Period t1)>

Figure 5:
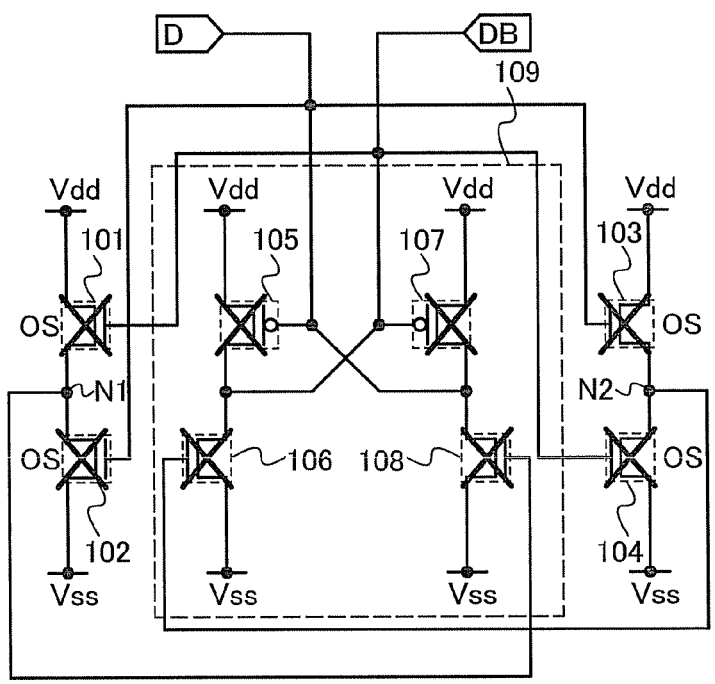
FIG. 5 is a circuit diagram showing operation of a memory element according to one embodiment of the present invention.

With reference to FIG. 4 and FIG. 5, a power-off state (period t1) of the memory element 100 is described.

For example, although a potential Low (0 V) is applied to the node N1 and the potential $V_{hold}$ is applied to the node N2, the potential of the node N2 is reduced to be an intermediate potential between Low and the threshold voltage of an n-channel transistor ($V_{th\_n}$) due to the long stop of supplying power. Note that since the power is not supplied, the high power supply potential $V_{dd}$, the low power supply potential $V_{ss}$, and the potentials of the first terminal D and the second terminal DB are Low. In other words, the first transistor 101 to the eighth transistor 108 are in an off state.

<Power Supply (Period t2)>

Figure 6:
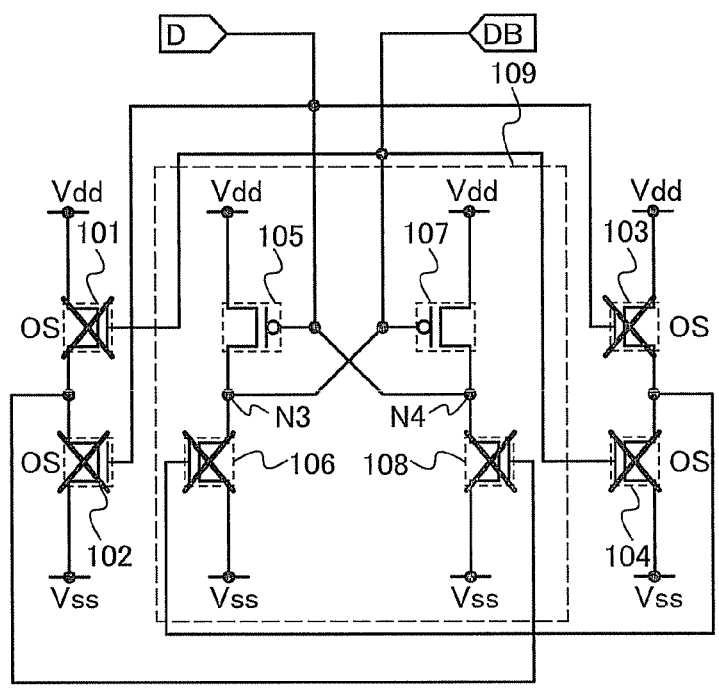
FIG. 6 is a circuit diagram showing operation of a memory element according to one embodiment of the present invention.

With reference to FIG. 4 and FIG. 6, a state where power is supplied to the memory element 100 (period t2) is described.

When power is supplied to the memory device, a potential High is applied to the wiring for supplying the high power supply potential $V_{dd}$ to which the other of the source and the drain of each of the first transistor 101, the third transistor 103, the fifth transistor 105, and the seventh transistor 107 are connected.

Note that even after power is supplied to the memory device, the potentials of the first terminal D and the second terminal DB remain at Low for some time before electric charge is not accumulated in the first terminal D and the second terminal DB. As a result, while the fifth transistor 105 and the seventh transistor 107 which are p-channel transistors are turned on, the first transistor 101 to the fourth transistor 104, the sixth transistor 106, and the eighth transistor 108 which are n-channel transistors remain in an off state.

When the fifth transistor 105 and the seventh transistor 107 are turned on, electric charge is accumulated in a node N3 where the one of a source and a drain of the fifth transistor 105, the one of a source and a drain of the sixth transistor 106, the gate of the seventh transistor 107, and the second terminal DB are connected and a node N4 where the one of a source and a drain of the seventh transistor 107, the one of a source and a drain of the eighth transistor 108, the gate of the fifth transistor 105, and the first terminal D are connected. Accordingly, the potentials of the node N3 and the node N4, that is, the potentials of the first terminal D and the second terminal DB, increase.

<Charge State in Node N1 and Node N2 (Period t3)>

Figure 7:
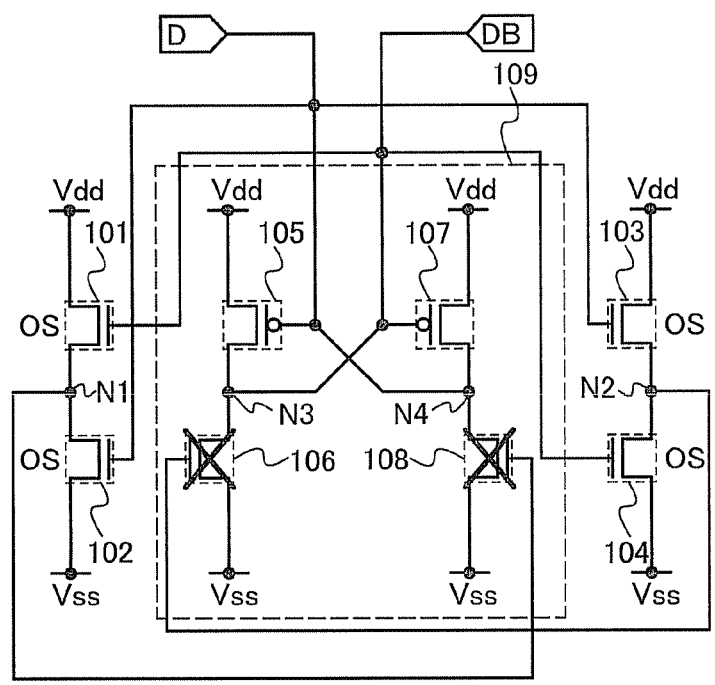
FIG. 7 is a circuit diagram showing operation of a memory element according to one embodiment of the present invention.

With reference to FIG. 4 and FIG. 7, a state where electric charge is accumulated in the node N1 and the node N2 (period t3) is described.

Since the node N3 and the node N4 are connected to the second terminal DB and the first terminal D, respectively, the potentials of the node N3 and the node N4 (that is, potentials of the first terminal D and the second terminal DB) are increased, and when the potentials become equal to or higher than the threshold voltage of each of the first transistor 101 to the fourth transistor 104 ($V_{th\_OS}$), the first transistor 101 to the fourth transistor 104 are turned on.

Since the other of the source and the drain of each of the first transistor 101 and the third transistor 103 are connected to the wiring for supplying the high power supply potential $V_{dd}$ to which the voltage High is applied, current flows through the first transistor 101 and the third transistor 103, electric charge is accumulated in the node N1 and the node N2, and the potentials of the node N1 and the node N2 are increased.

<Off State of P-Channel Transistor (Period t4)>

Figure 8:
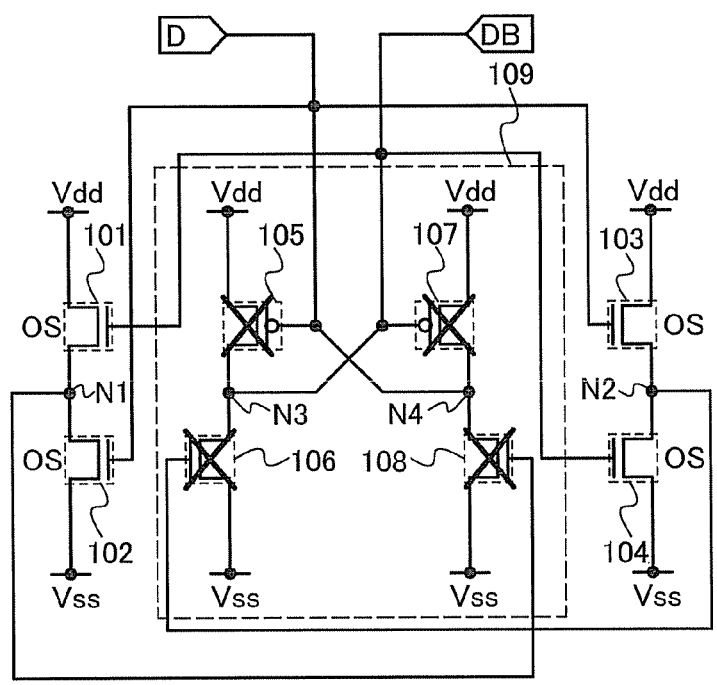
FIG. 8 is a circuit diagram showing operation of a memory element according to one embodiment of the present invention.

With reference to FIG. 4 and FIG. 8, the non-conduction state of a p-channel transistor (period t4) is described.

During the period t3, the potentials of the first terminal D and the second terminal DB are increased to High. As a result, the fifth transistor 105 and the seventh transistor 107 which are p-channel transistor are turned off. Further, since the sixth transistor 106 and the eighth transistor 108 which are n-channel transistors are in an off state, the potentials of the node N3 and the second terminal DB and the potentials of the node N4 and the first terminal D are High.

<On State of Sixth Transistor and Reduction in Potential of First Terminal D (Period t5)>

Figure 9:
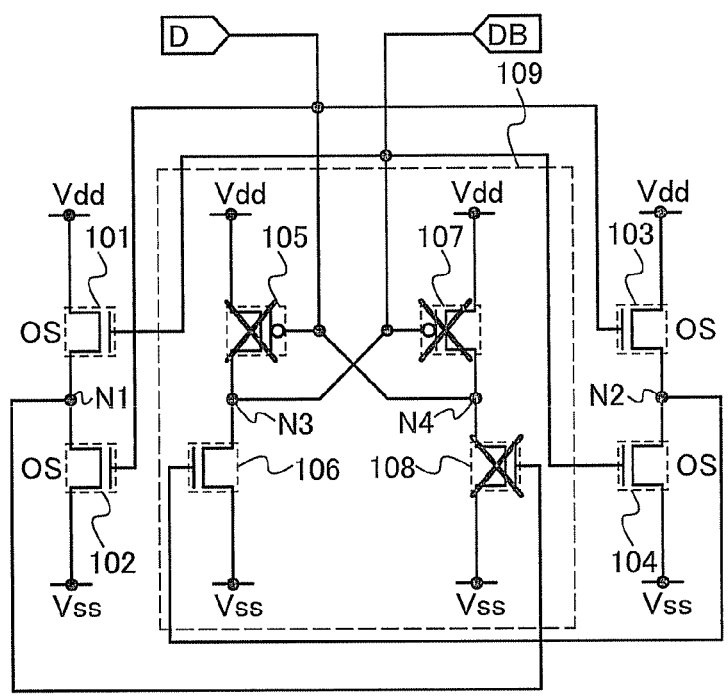
FIG. 9 is a circuit diagram showing operation of a memory element according to one embodiment of the present invention.

With reference to FIG. 4 and FIG. 9, a conduction state of the sixth transistor which is an n-channel transistor and a reduction in the potential of the first terminal D (period t5) are described.

Since the potential of the first terminal D and the potential of the second terminal DB are High, the first transistor 101 to the fourth transistor 104 are in an on state, and thus current flows. As a result, the potentials of the node N1 and the node N2 are increased. Note that the potential of the node N2 is higher than that of the node N1 in a state where power is not supplied; the potential of the node N2 is increased to a value higher than or equal to the threshold voltage of the sixth transistor 106 ($V_{th\_n}$) which is an n-channel transistor, before the potential of the node N1 is increased to the above value. Since the node N2 is connected to the gate of the sixth transistor 106, the sixth transistor 106 is turned on.

The fifth transistor 105 which is connected to the sixth transistor 106 in series is in an off state; thus, the potential of the node N3 where the fifth transistor 105, the sixth transistor 106, and the second terminal DB are connected decreases. On the other hand, the potential of the node N4 to which the first terminal D is connected does not change because the seventh transistor 107 and the eighth transistor 108 are in an off state.

<Off State of First Transistor and Fourth Transistor and Completion of Refresh Operation (Period t6)>

Figure 10:
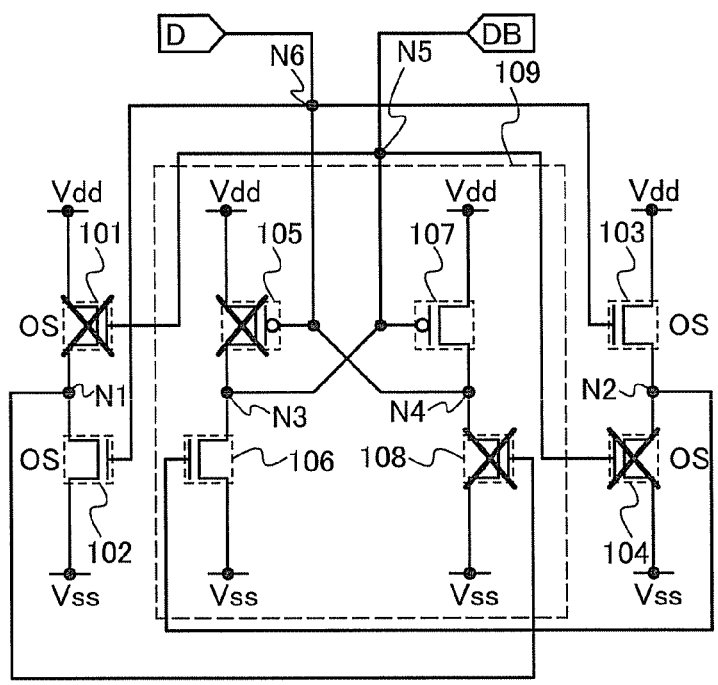
FIG. 10 is a circuit diagram showing operation of a memory element according to one embodiment of the present invention.

With reference to FIG. 4 and FIG. 10, the non-conduction state of the first transistor and the fourth transistor, and completion of the refresh operation (period t6) are described.

When the potential of the second terminal DB is decreased to be lower than the threshold voltage of the first transistor 101 and the fourth transistor 104 ($V_{th\_OS}$), the first transistor 101 and the fourth transistor 104 each of which has the gate connected to the second terminal DB are turned off. Thus, the potential of the node N1 is decreased. Further, the potential of the node N2 becomes higher than that during the periods t3 to t5.

In addition, the seventh transistor 107 whose gate is connected to the second terminal DB is turned on. On the other hand, the eighth transistor 108 is in an off state because the potential of the node N1 is decreased. Thus, the potential of the node N4 is increased to High and then becomes stabilized.

Further, the fifth transistor 105 whose gate is connected to the first terminal D with a potential High is in an off state. On the other hand, the sixth transistor 106 is in an on state because the potential of the node N2 is increased. Thus, the potential of the node N3 is decreased to Low and then becomes stabilized.

Consequently, the node N1 has a potential of 0 V (Low) and the same logical value (Low) as the second terminal DB. Further, the node N2 has the potential $V_{hold}$ and the same logical value (High) as the first terminal D.

In the memory element described in this embodiment, data is held in a node where one of a source and a drain of the transistor whose channel region is formed in an oxide semiconductor film is connected to a gate of the n-channel transistor or the p-channel transistor. The transistor whose channel region is formed in an oxide semiconductor film has an extremely small amount of off-state current; thus, even after supplying the power supply voltage is stopped, the voltage of the node can be held for a long time. That is, the memory element functions as a nonvolatile memory element.

The refresh operation after power is supplied is easily performed. Thus, malfunction in holding data can be reduced and a backup operation is not needed. As a result, the starting time can be shortened.

A magnetic tunnel junction element (an MTJ element) is known as a nonvolatile memory element. The MTJ element stores data in a low resistance state when the magnetization directions of ferromagnetic films provided above and below with an insulating film provided therebetween are parallel, and stores data in a high resistance state when the spin directions are anti-parallel. Therefore, the principles of the MTJ element and the memory device including an oxide semiconductor in this embodiment are completely different from each other. Table 1 shows comparison between the MTJ element and the semiconductor device according to this embodiment.

TABLE 1

|  | Spintronics (MTJ element) | Oxide Semiconductor |
|---|---|---|
| 1) Heat Resistance | Curie Temperature | Process Temperature at 500° C. (Reliability at 150° C.) |
| 2) Driving Method | Current Driving | Voltage Driving |
| 3) Principle of Writing Operation | Changing Magnetization | On/Off of FET Direction of Magnetic Film |
| 4) Si LSI | Suitable for Bipolar LSI | Suitable for MOS LSI |
| 5) Overhead | Large (Due to Large Joule Heat) | Smaller by 2 to 3 or more Orders of Magnitude than the MTJ Element (Because of charging and discharging of parasitic capacitance) |
| 6) Nonvolatility | Utilizing Spin | Utilizing Small Off-State Current |
| 7) Number of Times of Holding Electric Charge | Unlimited | Unlimited |
| 8) 3D Display | Difficult (At Most Two Layers) | Easy (Number of Layers is Unlimited) |
| 9) Integration Degree ($F^2$) | $4 F^2$ to $15 F^2$ | Depending on Number of Layers for 3D Display |
| 10) Material | Magnetic Rare Earth Element | Oxide Semiconductor Material |
| 11) Cost per Bit | High | Low |
| 12) Magnetic Field Resistance | Low | High |

The MTJ element is disadvantageous in that ferromagnetic property thereof is lost when the temperature is the Curie temperature or higher because a magnetic material is used. In addition, the MTJ element is compatible with a silicon bipolar device because current driving is employed; however, the bipolar device is unsuitable for high integration. Furthermore, the MTJ element has a problem in that power consumption is increased by an increase in memory capacity, though the MTJ element consumes an extremely small amount of current during data writing.

In principle, the MTJ element has low resistance to a magnetic field, so that the magnetization direction is likely to change when the MTJ element is exposed to a high magnetic field. Further, it is necessary to control magnetic fluctuation due to nanoscaling of a magnetic body used for the MTJ element.

Further, a rare-earth element is used for the MTJ element; therefore, incorporation of a process of the MTJ element into a process of a silicon semiconductor which avoids metal contamination should be paid high attention to. Further, the material cost per bit of the MTJ element may be expensive.

On the other hand, the transistor including an oxide semiconductor, which is described in this embodiment, has an element structure and an operation principle which are similar to those of a silicon MOSFET except that a semiconductor material for forming a channel is a metal oxide. Further, the transistor including an oxide semiconductor is not affected by a magnetic field, and does not cause soft errors. This shows that the transistor is highly compatible with a silicon integrated circuit.

This embodiment can be implemented in appropriate combination with any of the other embodiments.

Embodiment 2

In this embodiment, a memory device including a memory element described in Embodiment 1 will be described with reference to FIG. 11 and FIG. 12.

Figure 11:
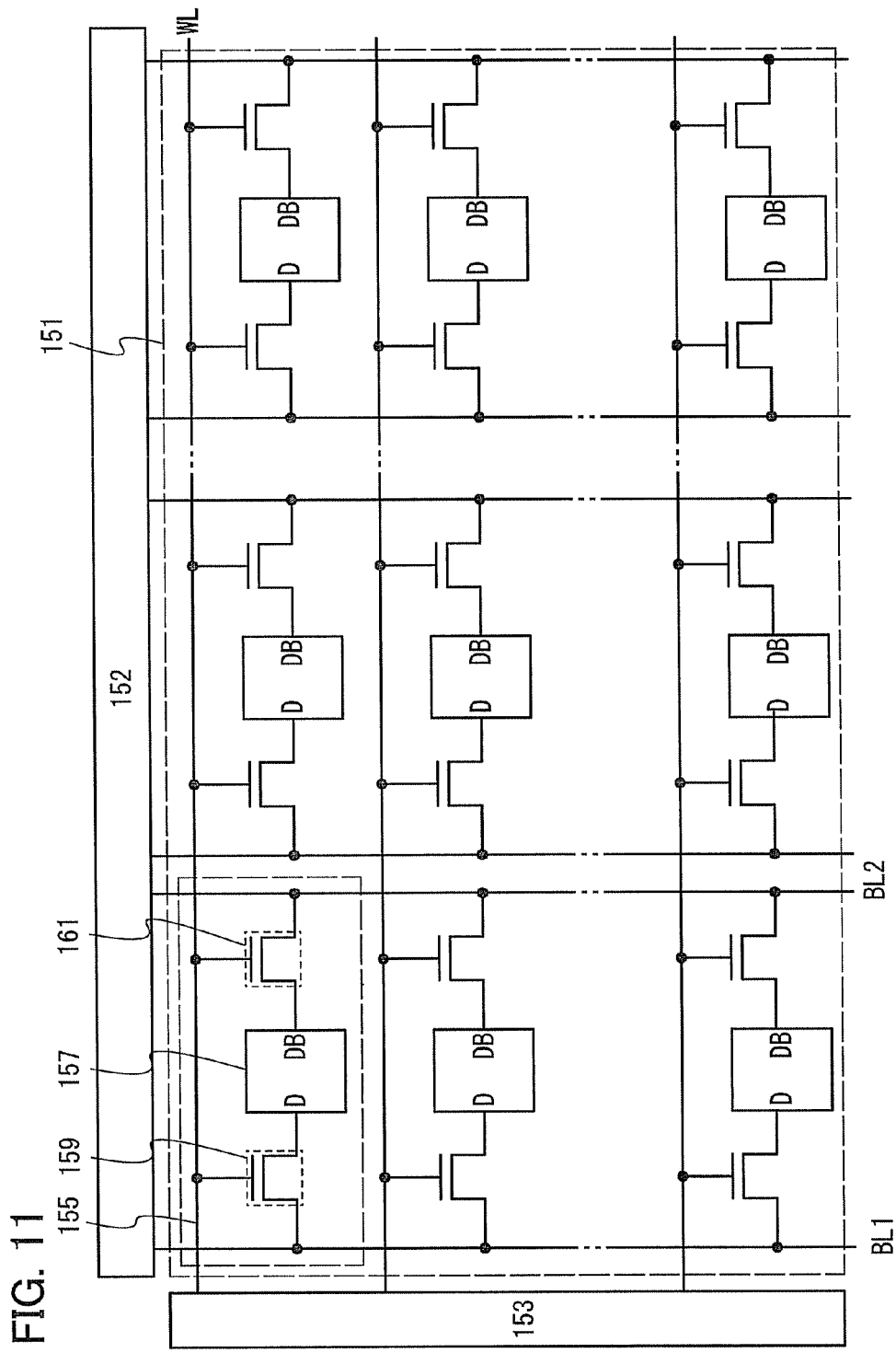
FIG. 11 is a diagram showing a memory device according to one embodiment of the present invention.

The memory device shown in FIG. 11 includes a memory cell array 151, a column decoder 152, a row decoder 153, and an interface circuit (not shown). The memory cell array 151 includes a plurality of memory cells 155 arranged in matrix. The memory cell 155 includes a memory element 157 and a first switch 159 and a second switch 161 whose gates are connected to a word line. One of a source and a drain of the first switch 159 is connected to a first bit line BL1, and the other of the source and the drain thereof is connected to a first terminal D of the memory element 157. One of a source and a drain of the second switch 161 is connected to a second bit line BL2, and the other of the source and the drain of thereof is connected to a second terminal DB of the memory element 157. Note that to the second bit line BL2, an inverted signal of a signal input to the first bit line BL1 is input.

The interface circuit generates signals for driving the column decoder 152 and the row decoder 153 from external signals and outputs data which is read from the memory cell 155 to the outside.

The column decoder 152 receives a signal for driving the memory cell 155 from the interface circuit and generates signals which are to be transmitted to the bit lines BL1 and BL2, which are used for instructing writing or reading data to the memory cell. The row decoder 153 receives a signal for driving the memory cell 155 from the interface circuit and generates a signal which is to be transmitted to a word line WL, which is used for instructing writing or reading data to the memory cell. With the signals which are to be output to the bit lines BL1 and BL2 from the column decoder 152 and the signal which is to be output to the word line WL from the row decoder 153, the memory cell which performs access in the memory cell array 151 is uniquely determined.

As the memory element 157, the memory element M, 100 or 110, described in Embodiment 1 can be employed as appropriate.

A memory device different from that of FIG. 11 is described with reference to FIG. 12.

Figure 12:
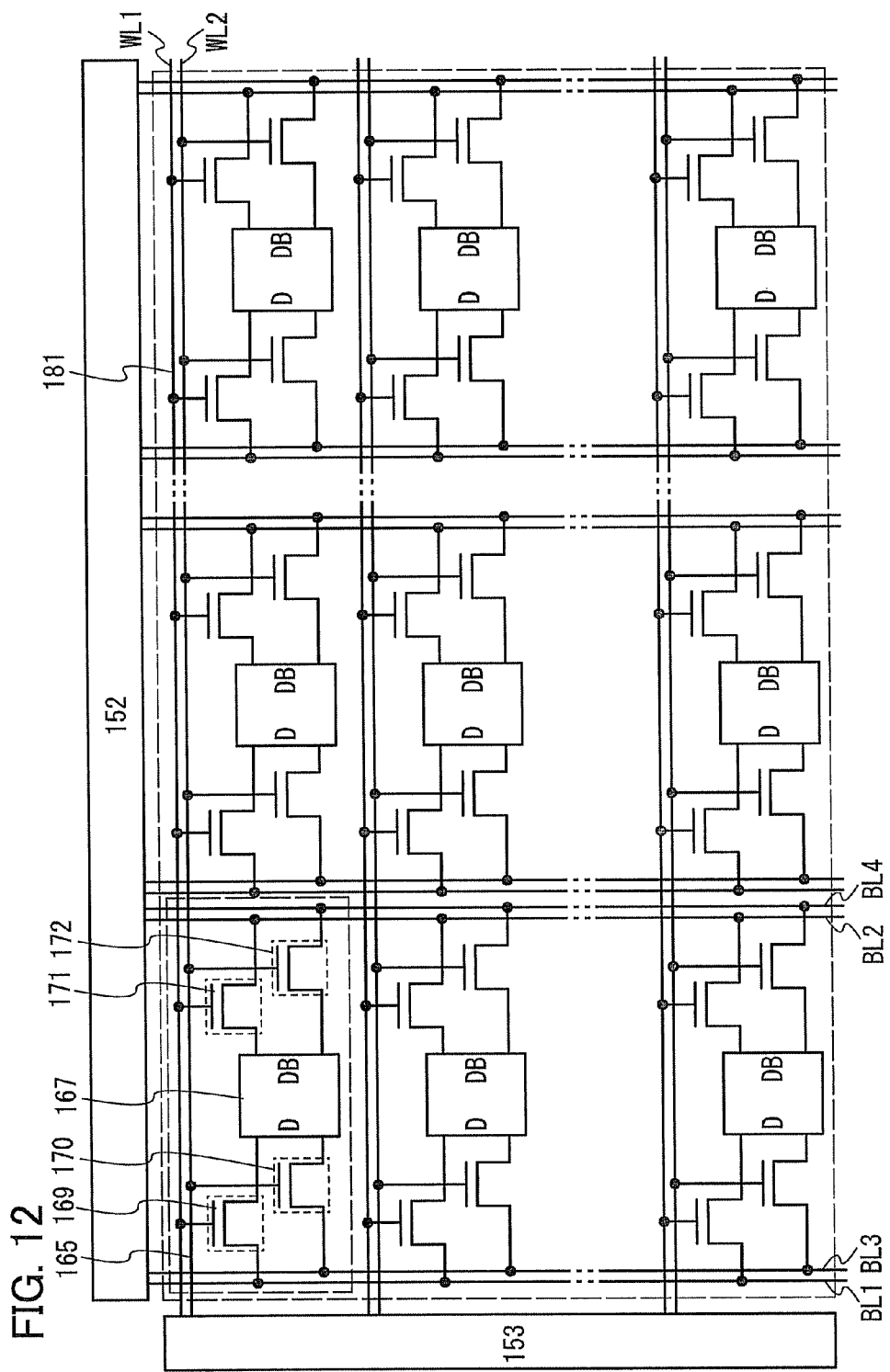
FIG. 12 is a diagram showing a memory device according to one embodiment of the present invention.

The memory device shown in FIG. 12 includes a memory cell array 181, a column decoder 152, a row decoder 153, and an interface circuit (not shown). The memory cell array 181 includes a plurality of memory cells 165 arranged in matrix. The memory cell 165 includes a memory element 167, a first switch 169 and a second switch 171 whose gates are connected to a first word line WL1, a third switch 170 and a fourth switch 172 whose gates are connected to a second word line WL2.

One of a source and a drain of the first switch 169 is connected to a first bit line BL1, and the other of the source and the drain thereof is connected to a first terminal D of the memory element 167. One of a source and a drain of the second switch 171 is connected to a second bit line BL2, and the other of the source and the drain thereof is connected to a second terminal DB of the memory element 167. One of a source and a drain of the third switch 170 is connected to a third bit line BL3, and the other of the source and the drain thereof is connected to the first terminal D of the memory element 167. One of a source and a drain of the fourth switch 172 is connected to a fourth bit line BL4, and the other of the source and the drain thereof is connected to the second terminal DB of the memory element 167. Note that an inverted signal of a signal input to the first bit line BL1 is input to the second bit line BL2, and an inverted signal of a signal input to the fourth bit line BL4 is input to the third bit line BL3.

The column decoder 152 receives a signal for driving the memory cell 165 from the interface circuit and generates signals for writing or reading which are to be transmitted to the first bit line BL1 to the fourth bit line BL4, which are used for instructing writing or reading data to the memory cell. The row decoder 153 receives a signal for driving the memory cell 165 from the interface circuit and generates signals for writing or reading which are to be transmitted to the first world line WL1 and the second word line WL2, which are used for instructing writing or reading data to the memory cell. With the signals which are to be output to the first bit line BL1 to the fourth bit line BL4 from the column decoder 152 and the signals which are to be output to the first word line WL1 and the second word line WL2 from the row decoder 153, the memory cell which performs access in the memory cell array 181 is uniquely determined.

The memory devices shown in FIG. 11 and FIG. 12 have a structure similar to a conventional SRAM, except the memory element. Further, the memory elements 157 and 167 are nonvolatile memory elements; thus, the memory devices described in this embodiment are nonvolatile SRAMs.

The writing and reading operation of the memory device is described. Here, the memory device shown in FIG. 11 is used as a typical example.

<Data Writing>

The word line WL is set to High, and the first switch 159 and the second switch 161 are turned on. At this time, the first bit line BL1 is set to High, and the second bit line BL2 is set to Low. Thus, High is input from the first switch 159 to the first terminal D of the memory element 157. Further, Low is input from the second switch 161 to the second terminal DB of the memory element 157. As a result, electric charge can be held in a node of the memory element 157, and data can be written. For example, in the case of the memory element 100 in FIG. 2, data "0" can be written to the node N1 and data "1" can be written to the node N2. In the case of the memory element 110 in FIG. 3, data "0" can be written to the node N11 and data "1" can be written to the node N12.

On the other hand, the first bit line BL1 is set to Low, and the second bit line BL2 is set to High when the first switch 159 and the second switch 161 are turned on by setting the word line WL to High. As a result, in the case of the memory element 100 in FIG. 2, data "1" can be written to the node N1 and data "0" can be written to the node N2. In the case of the memory element 110 in FIG. 3, data "1" can be written to the node N11 and data "0" can be written to the node N12.

<Data Holding>

Since the memory element described in Embodiment 1 is a nonvolatile memory element, data can be held in the node even when power supply of the memory device is turned off.

<Data Reading>

After a precharge circuit provided in the column decoder 152 adjusts the potentials of the bit lines BL1 and BL2, the word line WL is set to High, and the first switch 159 and the second switch 161 are turned on. At this time, in the case of the memory element 100 in FIG. 2, data which is based on electric charge in the node N1 is read out from the first bit line BL1 via the first terminal D of the memory element 157, and data which is based on electric charge in the node N2 is read out from the second bit line BL2 via the second terminal DB of the memory element 157. In the case of the memory element 110 of FIG. 3, data which is based on electric charge in the node N11 is read out from the first bit line BL1 via the first terminal D of the memory element 157, and data which is based on electric charge in the node N12 is read out from the second bit line BL2 via the second terminal DB of the memory element 157.

Note that the first bit line BL1 and the second bit line BL2 are connected to an amplifier circuit, and data is output from a reading circuit.

Since the memory element described in Embodiment 1 is a nonvolatile memory element, supplying power to a memory cell to/from which data is not written/read can be stopped in the memory device. Thus, power consumption can be further reduced as compared with that of the conventional SRAM.

In each memory cell of the memory device shown in FIG. 12, two switches which are connected to different world lines and different bit lines are provided on the first input terminal side of the memory element, and two switches which are connected to different world lines and different bit lines are provided on the second input terminal side of the memory element. Thus, the write data is input to the first word line WL1, the first bit line BL1, and the second bit line BL2, and the read data is input to a fourth word line WL4, the third bit line BL3, and the fourth bit line BL4, whereby writing and reading data can be performed at same time using different memory cells.

This embodiment can be implemented in appropriate combination with any of the other embodiments.

Embodiment 3

In this embodiment, a method for manufacturing the memory device described in Embodiment 2 will be described with reference to FIG. 2, FIGS. 13A to 13D, FIGS. 14A to 14C, FIGS. 15A to 15C, and FIGS. 16A and 16B. Here, a method for manufacturing the first transistor 101 which includes a channel region formed in an oxide semiconductor film, the seventh transistor 107 that is a p-channel transistor, and the eighth transistor 108 that is an n-channel transistor, which are illustrated in a circuit diagram of FIG. 2, is described. In FIGS. 13A to 13D, FIGS. 14A to 14C, FIGS. 15A to 15C, and FIGS. 16A and 16B, cross-sectional views along A-B correspond to a cross section of a region where the first transistor 101, the seventh transistor 107, and the eighth transistor 108 are formed, and cross-sectional views along C-D correspond to a cross section of a region where one of a source and a drain of the first transistor 101 is connected to the gate of the eighth transistor 108.

Figure 13A:
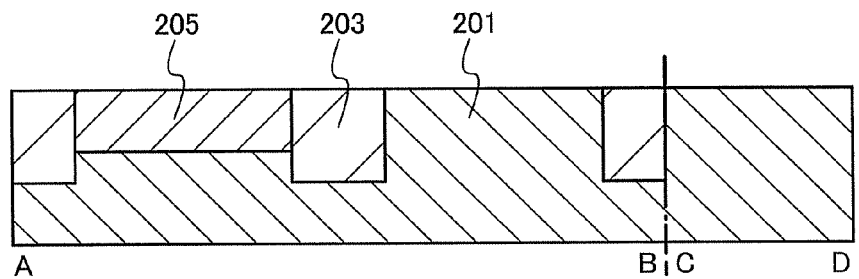
FIGS. 13A to 13D are cross-sectional views illustrating a method for manufacturing a memory device according to one embodiment of the present invention.

As illustrated in FIG. 13A, an element isolation region 203 is formed in an n-type semiconductor substrate 201, and then a p-well region 205 is formed in part of the n-type semiconductor substrate 201.

Examples of substrates used as the n-type semiconductor substrate 201 include a single crystal silicon substrate (a silicon wafer) having n-type conductivity, and a compound semiconductor substrate (e.g., a SiC substrate, a sapphire substrate, a GaN substrate, or the like).

An SOI (silicon on insulator) substrate may be used instead of the n-type semiconductor substrate 201, and as the SOI substrate, the following substrate can be given: a so-called SIMOX (separation by implanted oxygen) substrate which is formed in such a manner that after an oxygen ion is implanted into a mirror-polished wafer, an oxide layer is formed at a certain depth from the surface by high-temperature heating and eliminating defects generated in a surface layer, or an SOI substrate formed by using a technique called a Smart-Cut method in which a semiconductor substrate is cleaved by utilizing growth of a minute void, which is formed by implantation of a hydrogen ion, by thermal treatment; an ELTRAN (epitaxial layer transfer: a registered trademark of Canon Inc.) method; or the like. Further alternatively, instead of the n-type semiconductor substrate 201, a substrate where a semiconductor layer having crystallinity is formed over an insulating substrate may be used.

The element isolation region 203 is formed by a known local oxidation of silicon (LOCOS) method or shallow trench isolation (STI) method, or the like.

To the p-well region 205, an impurity element imparting p-type conductivity, such as boron, is added at a concentration about $5\times10^{15}$ cm$^{-3}$ to $1\times10^{16}$ cm$^{-3}$. With use of a mask formed over part of the semiconductor substrate 201, an impurity element imparting p-type conductivity is added to another part of the semiconductor substrate 201, so that the p-well region 205 is formed.

Note that although the n-type semiconductor substrate is used here, a p-type semiconductor substrate may be used, and an impurity element imparting n-type conductivity, such as phosphorus or arsenic, may be added to the p-type semiconductor substrate to form an n-well region.

Figure 13B:
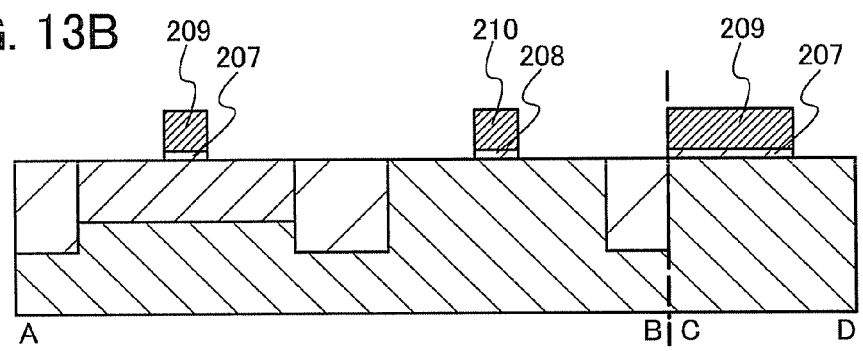

Next, as illustrated in FIG. 13B, gate insulating films 207 and 208 and gate electrodes 209 and 210 are formed over the semiconductor substrate 201.

A surface of the semiconductor substrate 201 is oxidized by performing heat treatment, so that a silicon oxide film is formed. Alternatively, a silicon oxide film is formed by a thermal oxidation method, and a surface of the silicon oxide film is nitrided by nitriding treatment, so that a stacked structure of the silicon oxide film and a film including oxygen and nitrogen (oxynitride silicon film) is formed. Next, part of the silicon oxide film or stacked structure of the silicon oxide film and the silicon oxynitride film is selectively etched, so that the gate insulating films 207 and 208 are formed. Alternatively, a silicon oxide, a silicon oxynitiride, or a high dielectric constant substance (also referred to as a high-k material) including a metal oxide such as a tantalum oxide, a hafnium oxide, a hafnium silicate oxide, a zirconium oxide, an aluminum oxide, or a titanium oxide or a rare-earth oxide such as a lanthanum oxide, or the like is deposited to have a thickness of 5 to 50 nm by a CVD method, a sputtering method, or the like, and then the oxide is partly etched selectively, so that the gate insulating films 207 and 208 are formed.

The gate electrodes 209 and 210 are preferably formed using a material selected from metals such as tantalum, tungsten, titanium, molybdenum, chromium, and niobium, or an alloy material or a compound material including any of the metals as its main component. Further, polycrystalline silicon to which an impurity element such as phosphorus is added can be used. Alternatively, the gate electrodes 209 and 210 are formed with a stacked structure of a metal nitride film and the above metal film. As the metal nitride, tungsten nitride, molybdenum nitride, or titanium nitride can be used. When the metal nitride film is provided, adhesiveness of the metal film formed on the metal nitride film can be increased; accordingly, separation can be prevented.

The gate electrodes 209 and 210 are formed by depositing a conductive film by a sputtering method, a CVD method, or the like and etching part of the conductive film selectively.

Here, heat treatment is performed and a surface of the semiconductor substrate 201 is oxidized, so that a silicon oxide film is formed, and a conductive film in which a tantalum nitride film and a tungsten film are stacked is formed by a sputtering method over the silicon oxide film. Then, part of the silicon oxide film and part of the conductive film are selectively etched, so that the gate insulating films 207 and 208 and the gate electrodes 209 and 210 are formed.

Figure 13C:
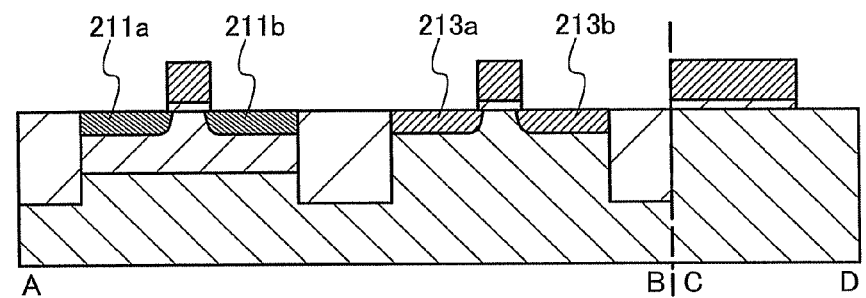

Next, as illustrated in FIG. 13C, an impurity element imparting p-type conductivity is added to the semiconductor substrate 201, so that p-type impurity regions 213a and 213b are formed. Further, an impurity element imparting n-type conductivity is added to the p-well region 205, so that n-type impurity regions 211a and 211b are formed. Each of the concentration of the impurity element imparting p-type conductivity in the p-type impurity regions 213a and 213b and the concentration of the impurity element imparting n-type conductivity in the n-type impurity regions 211a and 211b is higher than or equal to $1\times10^{19}$/cm$^3$ and lower than or equal to $1\times10^{21}$/cm$^3$. The impurity element imparting p-type conductivity and the impurity element imparting n-type conductivity are added to the p-well region 205 and the semiconductor substrate 201, respectively, by an ion doping method, an ion implantation method, or the like.

Figure 13D:
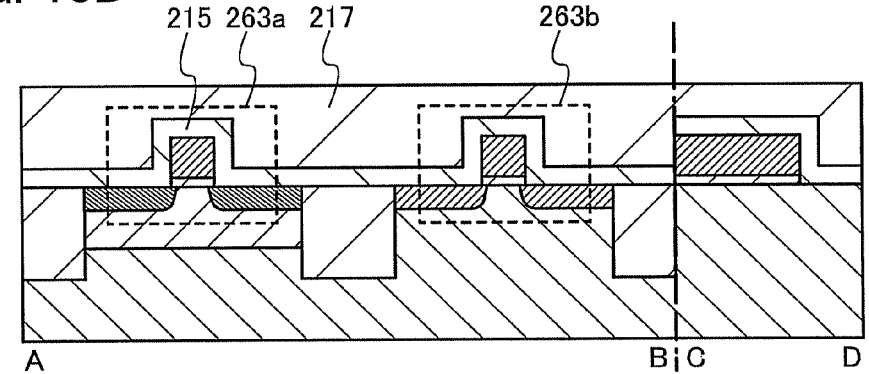

Next, as illustrated in FIG. 13D, insulating films 215 and 217 are formed over the semiconductor substrate 201, the element isolation region 203, the gate insulating films 207 and 208, and the gate electrodes 209 and 210 by a sputtering method, a CVD method, or the like.

The insulating films 215 and 217 each may be formed with a single layer or a stacked layer using one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, the amount of hydrogen in the insulating film 215 is increased. Thus, the semiconductor substrate is hydrogenated by heat treatment, and dangling bonds are terminated by hydrogen, so that defects can be reduced.

Note that planarity of the insulating film 217 can be high when the insulating film 217 is formed using an inorganic material such as boron phosphorus silicon glass (BPSG), or an organic material such as polyimide or acrylic.

After the insulating film 215 or the insulating film 217 is formed, heat treatment is performed to activate the impurity elements added to the impurity regions 211a, 211b, 213a, and 213b.

Through the above steps, the seventh transistor 107 that is a p-channel transistor and the eighth transistor 108 that is an n-channel transistor, illustrated in FIG. 2, can be manufactured.

Next, part of the insulating films 215 and 217 are selectively etched, so that opening portions are formed. Next, contact plugs 219a to 219d are formed in the opening portions. Typically, the contact plugs 219a to 219d are formed as follows: a conductive film is formed by a sputtering method, a CVD method, a plating method, or the like; and planarization treatment is performed on the conductive film by a chemical mechanical polishing (CMP) method to remove unnecessary portions of a surface of the conductive film.

For formation of the conductive film that is to be the contact plugs 219a to 219d, tungsten silicide is formed by a CVD method using a $WF_6$ gas and a $SiH_4$ gas, and the opening portions are filled with the conductive film.

Next, an insulating film is formed by a sputtering method, a CVD method, a plating method, or the like over the insulating film 217 and the contact plugs 219a to 219d, and then part of the insulating film is selectively etched, so that insulating films 221a to 221e each having a groove portion are formed. Next, a conductive film is formed by a sputtering method, a CVD method, or the like, and then planarization treatment is performed by a CMP method or the like to remove unnecessary portions of a surface of the conductive film, so that wirings 223a to 223c are formed (see FIG. 14A).

The insulating films 221a to 221e can be formed using a material similar to that of the insulating film 215.

The wirings 223a to 223c are formed to have a single-layer structure or a stacked-layer structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

With use of the planarized insulating films 221a to 221e and wirings 223a to 223c, variation in electric characteristics of transistors including an oxide semiconductor film formed later can be reduced. In addition, the transistors including an oxide semiconductor film can be formed with high yield.

Next, it is preferable that hydrogen, water, and the like included in the insulating films 221a to 221e and wirings 223a to 223c be eliminated by heat treatment or plasma treatment. As a result, hydrogen, water, and the like can be prevented from being diffused into an insulating film and an oxide semiconductor film, which are formed later, by heat treatment performed later. The heat treatment is performed at a temperature higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Next, an insulating film 225 is formed over the insulating films 221a to 221e and the wirings 223a to 223c by a sputtering method, a CVD method, or the like. The insulating film 225 is formed to have a single layer or a stacked layer using any of silicon oxide, silicon oxynitride, silicon nitride oxide, gallium oxide, hafnium oxide, yttrium oxide, aluminum oxide, or aluminum oxynitride. Further, the insulating film 225 is preferably formed using an oxide insulating film from which part of oxygen is released by heating. The oxide insulating film from which part of oxygen is released by heating is preferably an oxide insulating film which contains oxygen at a proportion exceeding the stoichiometric proportion. The oxide insulating film from which part of oxygen is released by heating can diffuse oxygen into the oxide semiconductor film by heating, because oxygen is released from the oxide insulating film by heating.

Figure 14A:
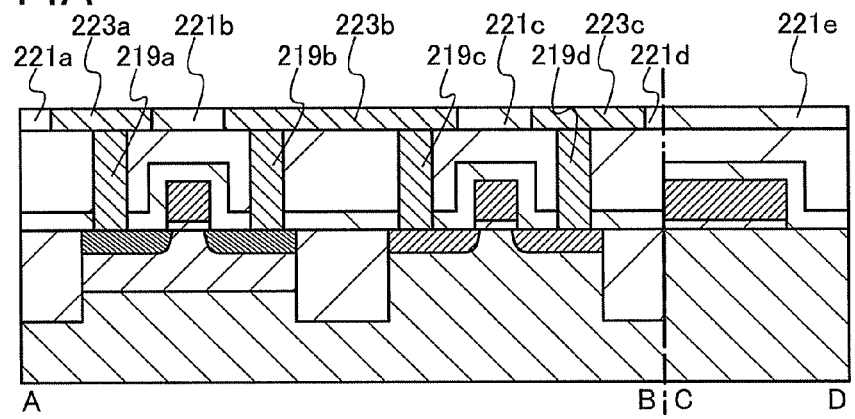
FIGS. 14A to 14C are cross-sectional views illustrating a method for manufacturing the memory device according to one embodiment of the present invention.
Figure 14B:
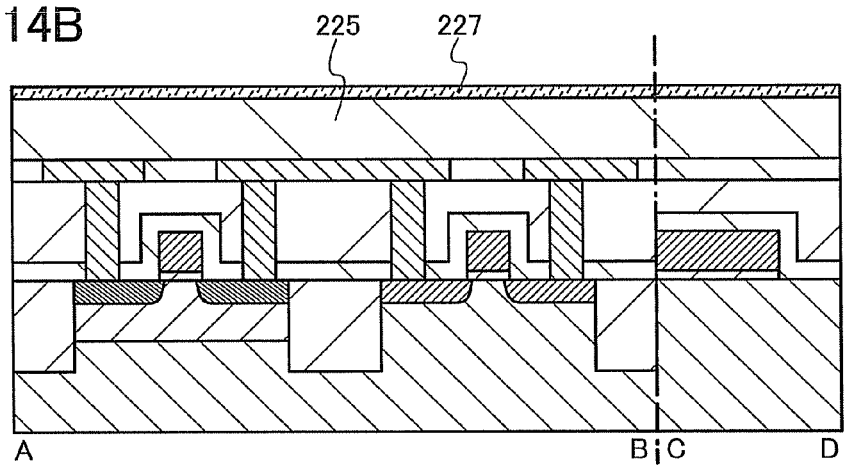
Figure 14C:
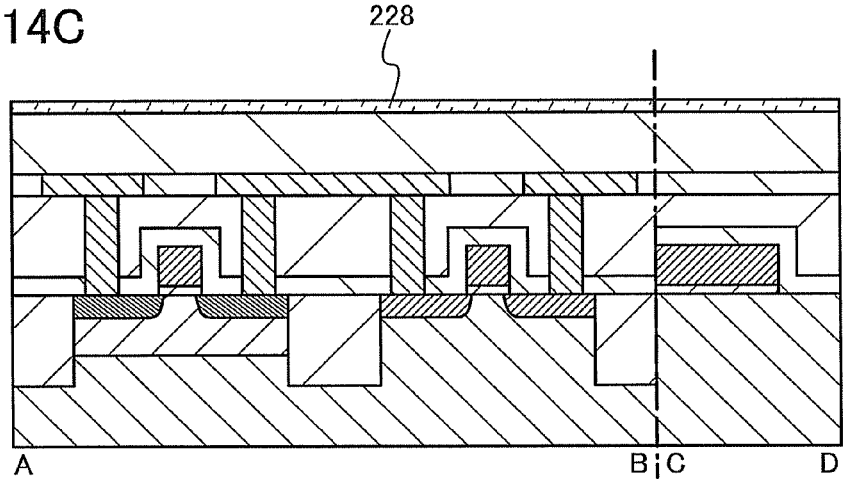

Next, an oxide semiconductor film 227 is formed over the insulating film 225 by a sputtering method, a coating method, a printing method, a pulsed laser deposition method, or the like (see FIG. 14B). Here, as the oxide semiconductor film 227, an oxide semiconductor film is formed by a sputtering method to have a thickness greater than or equal to 1 nm and less than or equal to 50 nm, preferably greater than or equal to 3 nm and less than or equal to 30 nm. When the oxide semiconductor film 227 has a thickness in the above range, a short-channel effect of the transistor can be suppressed.

The oxide semiconductor film 227 preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, a single-component metal oxide such as an indium oxide, a tin oxide, or a zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide can be used.

For the above-listed metal oxides, an In—Ga—Zn-based metal oxide, for example, is an oxide whose main components are In, Ga, and Zn, and there is no particular limitation on the ratio of In:Ga:Zn. Further, the In—Ga—Zn-based oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based metal oxide with an atomic ratio where In:Ga:Zn=1:1:1 (=1/3:1/3:1/3) or In:Ga:

Zn=2:2:1 (=2/5:2/5:1/5), or an oxide with an atomic ratio close to the above atomic ratios can be used. Alternatively, an In—Sn—Zn-based metal oxide with an atomic ratio where In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having the appropriate composition may be used depending on necessary semiconductor characteristics (e.g., field-effect mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high electric-filed mobility can be obtained relatively easily in the case where the In—Sn—Zn-based metal oxide is used. However, the field-effect mobility can be increased by reducing the defect density in the bulk also in the case where the In—Ga—Zn-based metal oxide is used.

Note that the case where the composition of an oxide having an atomic ratio, In:Ga:Zn=a:b:c (a+b+c=1), is in the neighborhood of the composition of an oxide having an atomic ratio, In:Ga:Zn=A:B:C (A+B+C=1), means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a planar surface can be obtained with relative ease, so that when a transistor is manufactured with use of the oxide semiconductor, interface scattering can be reduced, and relatively high field-effect mobility can be obtained with relative ease.

In an oxide semiconductor having crystallinity, defects in the bulk can be further reduced and when the surface flatness of the oxide semiconductor is improved, field-effect mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0}\int_{y_1}^{y_2}\int_{x_1}^{x_2}|f(x,y)-Z_0|dxdy \quad \text{[Formula 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

Note that the energy gap of a metal oxide which can fog the oxide semiconductor film 227 is 2 eV or more, preferably 2.5 eV or more, further preferably 3 eV or more. In this manner, the off-state current of a transistor can be reduced by using an oxide semiconductor having a wide energy gap.

The concentration of alkali metals or alkaline earth metals in the oxide semiconductor film 227 is preferably lower than or equal to $1\times10^{18}$ atoms/cm$^3$, further preferably lower than or equal to $2\times10^{16}$ atoms/cm$^3$. When an alkali metal or an alkaline earth metal is bonded to an oxide semiconductor, carriers are generated in some cases, which causes an increase in the off-state current of the transistor.

The oxide semiconductor film 227 may contain nitrogen at a concentration lower than or equal to $5\times10^{18}$ atoms/cm$^3$.

The oxide semiconductor film 227 may have an amorphous structure.

As the oxide semiconductor film 227, a c-axis aligned crystalline oxide semiconductor (CAAC-OS) film including crystallized parts may be used.

CAAC-OS is an oxide semiconductor including a crystal with c-axis alignment which has a triangular or hexagonal atomic arrangement when seen from the direction of an a-b plane, a surface, or an interface and in which metal atoms are arranged in a layered manner, or metal atoms and oxygen atoms are arranged in a layered manner along a c-axis, and the direction of the a-axis or the b-axis is varied in the a-b plane (or the surface or the interface), that is, which rotates around the c-axis.

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis direction.

The CAAC-OS is not a single crystal oxide, but this does not mean that the CAAC-OS is composed of only an amorphous component. Although the CAAC-OS includes a crystallized portion (crystalline portion), a boundary between one crystalline portion and another crystalline portion is not clear in some cases.

Nitrogen may be substituted for part of oxygen included in the CAAC-OS. The c-axes of individual crystalline portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like). Alternatively, the normals of the a-b planes of the individual crystalline portions included in the CAAC-OS may be aligned in one direction (e.g., a direction perpendicular to the substrate surface or the surface, film surface, interface, or the like of the CAAC-OS).

The CAAC-OS becomes a conductor, a semiconductor, or an insulator depending on its composition or the like. The CAAC-OS transmits or does not transmit visible light depending on its composition or the like.

An example of a crystal structure of the CAAC-OS will be described in detail with reference to FIGS. 17A to 17E, FIGS. 18A to 18C, and FIGS. 19A to 19C. In FIGS. 17A to 17E, FIGS. 18A to 18C, and FIGS. 19A to 19C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Furthermore, in FIGS. 17A to 17E, O surrounded by a circle represents tetracoordianate O and a double circle represents tricoordenate O.

Figure 17A:
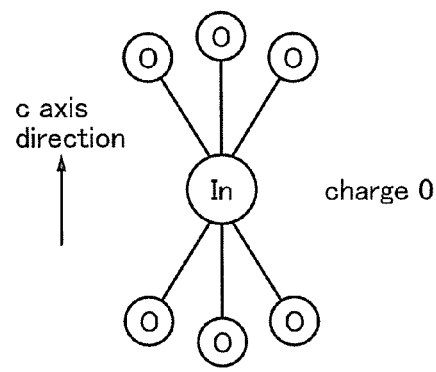
FIGS. 17A to 17E are diagrams each illustrating a crystal structure of an oxide material according to one embodiment of the present invention.

FIG. 17A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 17A is an octahedral structure, but is illustrated as a planar structure for simplicity. Note that three tetracoordinate O atoms exist in each of an upper half and a lower half in FIG. 17A. In the small group illustrated in FIG. 17A, electric charge is 0.

Figure 17D:
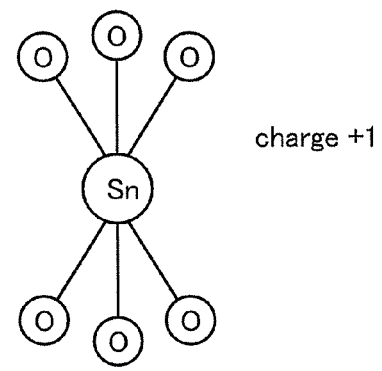
Figure 17B:
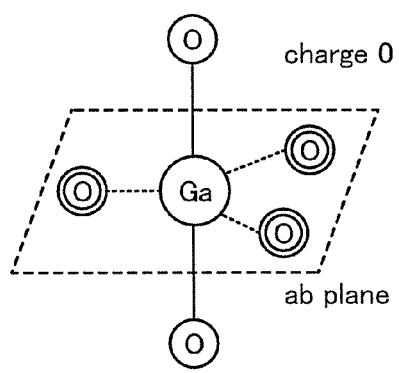

FIG. 17B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 17B. An In atom can also have the structure illustrated in FIG. 17B because an In atom can have five ligands. In the small group illustrated in FIG. 17B, electric charge is 0.

Figure 17E:
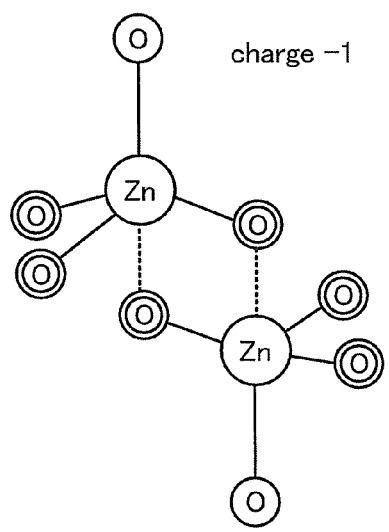
Figure 17C:
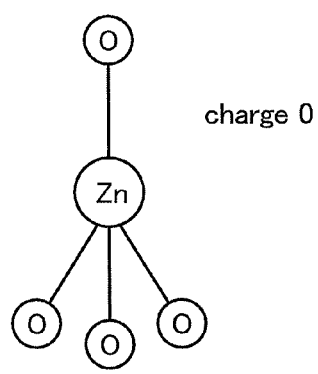

FIG. 17C illustrates a structure including one tetracoordinate Zn atom and four tetracoordinate O atoms proximate to the Zn atom. In FIG. 17C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 17C. In the small group illustrated in FIG. 17C, electric charge is 0.

FIG. 17D illustrates a structure including one hexacoordinate Sn atom and six tetracoordinate O atoms proximate to the Sn atom. In FIG. 17D, three tetracoordinate O atoms exist in each of an upper half and a lower half. In the small group illustrated in FIG. 17D, electric charge is +1.

FIG. 17E illustrates a small group including two Zn atoms. In FIG. 17E, one tetracoordinate O atom exists in each of an upper half and a lower half. In the small group illustrated in FIG. 17E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 17A each have three proximate In atoms in the downward direction, and the three O atoms in the lower half each have three proximate In atoms in the upward direction. The one O atom in the upper half with respect to the pentacoordinate Ga atom in FIG. 17B has one proximate Ga atom in the downward direction, and the one O atom in the lower half has one proximate Ga atom in the upward direction. The one O atom in the upper half with respect to the tetracoordinate Zn atom in FIG. 17C has one proximate Zn atom in the downward direction, and the three O atoms in the lower half each have three proximate Zn atoms in the upward direction. In this manner, the number of the tetracoordinated O atoms above the metal atom is equal to the number of the proximity metal atoms below the tetracoordinated O atoms. Similarly, the number of the tetracoordinate O atoms below the metal atom is equal to the number of the proximity metal atoms above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below, another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 18A:
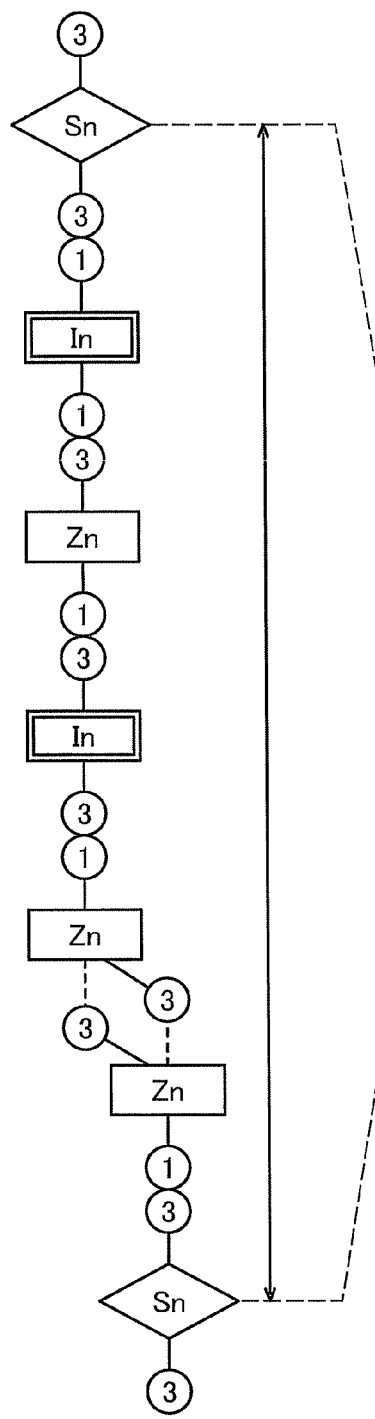
FIGS. 18A to 18C are diagrams illustrating a crystal structure of an oxide material according to one embodiment of the present invention.
Figure 18B:
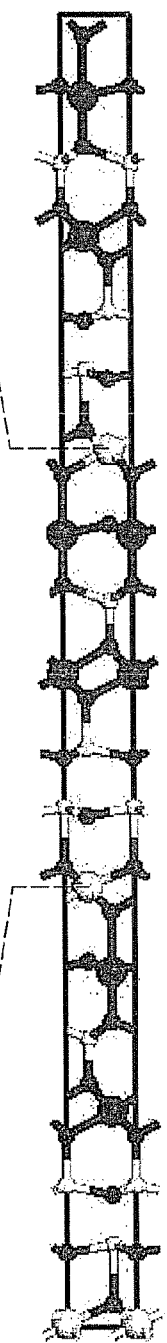
Figure 18C:
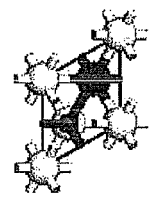

FIG. 18A illustrates a model of a medium group included in a layered structure of an In—Sn—Zn—O-based material. FIG. 18B illustrates a large group including three medium groups. Note that FIG. 18C illustrates an atomic arrangement in the case where the layered structure in FIG. 18B is observed from the c-axis direction.

In FIG. 18A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 18A, one tetracoordinate O atom existing in each of an upper half and a lower half with respect to an In atom is denoted by circled 1. FIG. 18A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 18A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 17E can be given. For example, with one small group including two Zn atoms, electric charge of one small group including a Sn atom can be cancelled, so that the total electric charge of the layered structure can be 0.

When the large group illustrated in FIG. 18B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based metal oxide; a three-component metal oxide such as an In—Ga—Zn-based metal oxide (also referred to as IGZO), an In—Al—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; and the like.

As an example, FIG. 19A illustrates a model of a medium group included in a layered structure of an In—Ga—Zn—O-based material.

In the medium group included in the layered structure of the In—Ga—Zn—O-based material in FIG. 19A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 19B illustrates a large group including three medium groups. Note that FIG. 19C illustrates an atomic arrangement in the case where the layered structure in FIG. 19B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 19A but also a medium group in which the arrangement of the In atom, the Ga atom, and the Zn atom is different from that in FIG. 19A.

When the large group illustrated in FIG. 19B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 20A:
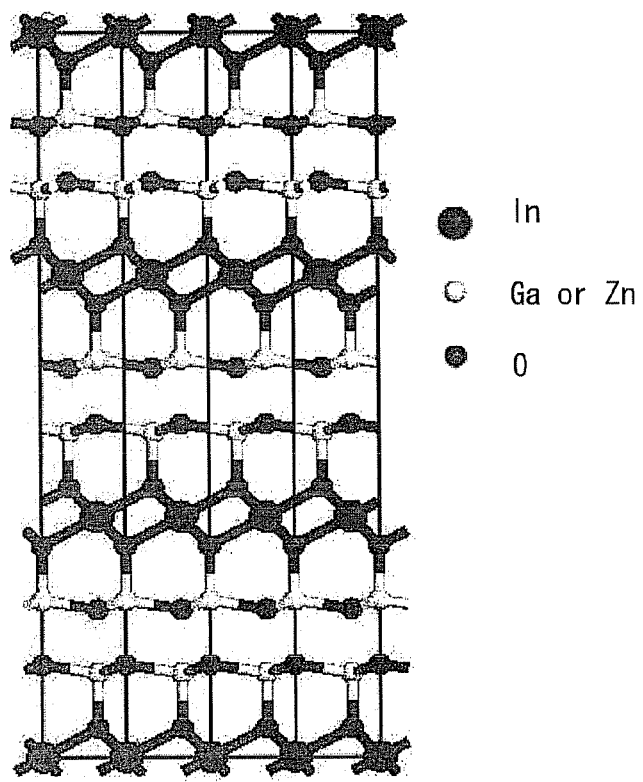
FIGS. 20A and 20B are diagrams each illustrating a crystal structure of an oxide material according to one embodiment of the present invention.

In the case where n=1 ($InGaZnO_4$), a crystal structure illustrated in FIG. 20A can be obtained, for example. Note that in the crystal structure in FIG. 20A, since a Ga atom and an In atom each have five ligands as described with FIG. 17B, a structure in which Ga is replaced with In can be obtained.

Figure 20B:
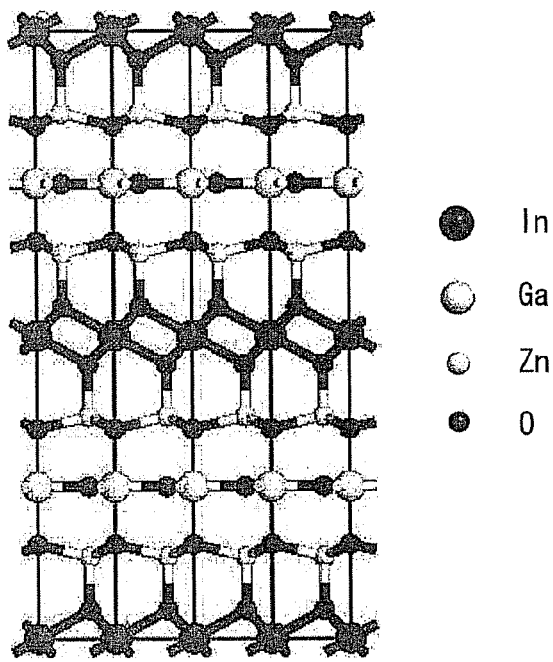

In the case where n=2 ($InGaZn_2O_5$), a crystal structure illustrated in FIG. 20B can be obtained, for example. Note that in the crystal structure in FIG. 20B, since a Ga atom and an In atom each have five ligands as described with FIG. 17B, a structure in which Ga is replaced with In can be obtained.

Here, as the oxide semiconductor film 227, an oxide semiconductor film having an amorphous structure is formed by a sputtering method.

As a target used in a sputtering method, a metal oxide target containing zinc can be used. As the target, a four-component metal oxide such as an In—Sn—Ga—Zn-based metal oxide, a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide, a two-component metal oxide such as an In—Zn-based metal oxide or a Sn—Zn-based metal oxide, or a single-component metal oxide such as a ZnO-based metal oxide or a SnO-based metal oxide can be used.

As an example of the target, a metal oxide target containing In, Ga, and Zn has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Alternatively, a target having a composition ratio where $In_2O_3:ZnO=25:1$ to $1:4$ [molar ratio] can be used.

In the case of forming a film of an In—Ga—Zn—O-based material as the oxide semiconductor film 227 by a sputtering method, it is preferable to use an In—Ga—Zn—O target having the following atomic ratio: the atomic ratio of In:Ga:Zn is 1:1:1, 4:2:3, 3:1:2, 1:1:2, 2:1:3, or 3:1:4. When an oxide semiconductor film 227 is formed using an In—Ga—Zn—O target having the aforementioned atomic ratio, a polycrystal or a CAAC-OS is easily formed.

In the case of forming the oxide semiconductor film 227 using an In—Sn—Zn—O-based material by a sputtering method, it is preferable to use an In—Sn—Zn—O target having an atomic ratio where In:Sn:Zn=1:1:1, 2:1:3, 1:2:2, or 20:45:35. When the oxide semiconductor film 227 is formed using an In—Sn—Zn—O target having the aforementioned atomic ratio, a polycrystal or a CAAC-OS is easily formed.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. It is preferable that a high-purity gas from which impurities including hydrogen are removed be used as a sputtering gas.

In a sputtering method, an RF power supply device, an AC power supply device, a DC power supply device, or the like can be used as a power supply device for generating plasma as appropriate.

The leakage rate of a treatment chamber in which the oxide semiconductor film is formed is preferably lower than or equal to $1 \times 10^{-10}$ Pa·m$^3$/sec., whereby entry of an impurity into the film to be formed by a sputtering method can be decreased.

Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Further, combination with a cryopump having a high capability in evacuating water or a sputter ion pump having a high capability in evacuating hydrogen is effective.

An adsorbate inside the treatment chamber where an oxide semiconductor film is formed does not affect the pressure in the treatment chamber because it is adsorbed on the inner wall, but leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

Note that before the oxide semiconductor film is formed by a sputtering apparatus, a dummy substrate may be put into the sputtering apparatus, and an oxide semiconductor film may be formed over the dummy substrate, so that hydrogen and water attached to the target surface or a deposition shield may be removed.

Hydrogen contained in the oxide semiconductor is reacted with oxygen bonded to a metal atom to be water, and in addition, a vacancy is formed in a lattice from which oxygen is eliminated (or a portion from which oxygen is removed). Thus, the impurities containing hydrogen are reduced as much as possible in the formation step of the oxide semiconductor film, whereby vacancies in the oxide semiconductor film can be reduced. Therefore, when a channel region is formed using an oxide semiconductor film which is highly purified by removing impurities as much as possible, a highly reliable transistor can be provided.

Next, hydrogen is released from the oxide semiconductor film 227 and part of oxygen contained in the insulating film 225 is diffused into the oxide semiconductor film and the vicinity of the interface between the oxide insulating film 225 and the oxide semiconductor film. As a result, in a transistor formed later, an oxide semiconductor film 228 with low hydrogen concentration can be formed (see FIG. 14C), and oxygen vacancies in the vicinity of the interface between the insulating film 225 and the oxide semiconductor film 228 is reduced.

The temperature of the heat treatment is preferably a temperature at which hydrogen is released from the oxide semiconductor film 227 and part of oxygen contained in the insulating film 225 is released and diffused into the oxide semiconductor film 227. The temperature is typically higher than or equal to 150° C. and lower than the strain point of the substrate, preferably higher than or equal to 250° C. and lower than or equal to 450° C., further preferably higher than or equal to 300° C. and lower than or equal to 450° C.

A rapid thermal annealing (RTA) apparatus can be used for the heat treatment. With of an RTA apparatus, the heat treatment can be performed at a temperature higher than or equal to the strain point of the substrate if the heating time is short. Therefore, time to release hydrogen from the oxide semiconductor film and to diffuse oxygen from the insulating film 225 into the oxide semiconductor film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere. The treatment time is three minutes to 24 hours. Alternatively, heat treatment may be performed in a reduced atmosphere or an inert gas atmosphere first, and then heat treatment may be performed in an oxygen atmosphere. When the heat treatment is performed in a reduced pressure atmosphere or an inert atmosphere, the impurity concentration in the oxide semiconductor film 227 can be reduced; however, oxygen vacancies are caused at the same time. By the heat treatment in the oxidation atmosphere, the caused oxygen vacancies can be reduced.

By performing heat treatment on the oxide semiconductor film 227, the impurity level in the film can be significantly reduced. Accordingly, the field-effect mobility of the transistor can be increased so as to be close to ideal field-effect mobility to be described later.

Next, part of the oxide semiconductor film 228 is selectively etched, so that an oxide semiconductor film 229 is formed. Then, an insulating film 231 is formed over the oxide semiconductor film 229 by a sputtering method, a CVD method, or the like. Then, a gate electrode 233 is formed over the insulating film 231 (see FIG. 15A).

The insulating film 231 may be formed with a single layer or a stacked layer using, for example, one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may also be an oxide insulating film from which oxygen is released by heating, like the insulating film 225. By using a film from which oxygen is released by heating as the insulating film 231, oxygen vacancies formed in the oxide semiconductor film 229 can be reduced by heat treatment performed later, and deterioration in electric characteristics of the transistor can be suppressed.

The insulating film 231 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current can be decreased even when the thickness of the gate insulating film is decreased.

The thickness of the insulating film 231 is preferably greater than or equal to 10 nm and less than or equal to 300 nm, further preferably greater than or equal to 5 nm and less than or equal to 50 nm, still further preferably greater than or equal to 10 nm and less than or equal to 30 nm.

The gate electrode 233 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese or zirconium may be used. Further, the gate electrode 233 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate electrode 233 is formed by a printing method or an inkjet method. Alternatively, the gate electrode 233 is formed in such a manner that a conductive film is formed by a sputtering method, a CVD method, an evaporation method, or the like and part of the conductive film is selectively etched.

As a material layer in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 233 and the insulating film 231. These films each have a work function higher than or equal to 5 eV, preferably higher than or equal to 5.5 eV; thus, the threshold voltage of the electric characteristics of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 229, or specifically, an In—Ga—Zn—O film having a nitrogen concentration of 7 at. % or higher can be used.

After that, heat treatment is preferably performed. By this heat treatment, oxygen can be diffused from the insulating film 225 and the insulating film 231 to the oxide semiconductor film 229 so as to fill oxygen vacancies in the oxide semiconductor film 229, and accordingly the oxygen vacancies can be reduced.

Figure 15A:
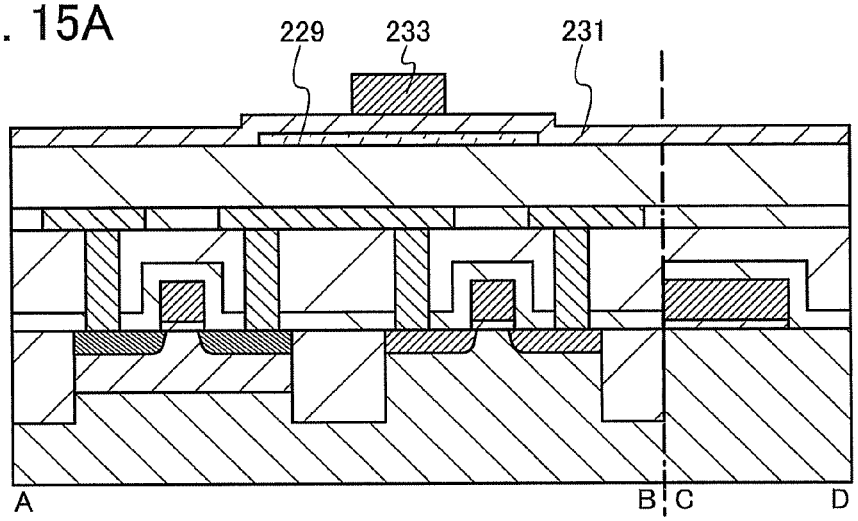
FIGS. 15A to 15C are cross-sectional views illustrating a method for manufacturing the memory device according to one embodiment of the present invention.
Figure 15B:
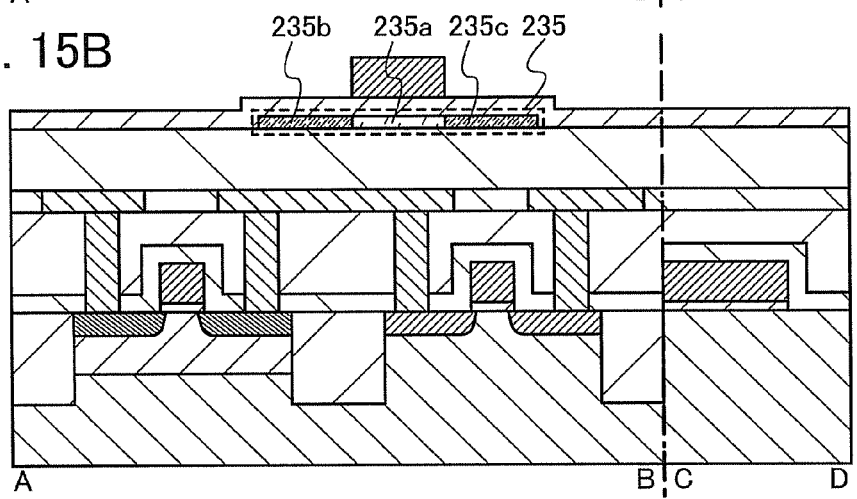

Next, with use of the gate electrode 233 as a mask, dopant is added to the oxide semiconductor film 229. As a result, a first region 235a which is covered with the gate electrode 233 and does not include the dopant and a pair of second regions 235b and 235c which include the dopant are formed as illustrated in FIG. 15B. Since the gate electrode 233 is used as a mask when the dopant is added, the first region 235a to which the dopant is not added and the pair of second regions 235b and 235c including dopant can be formed in a self-aligned manner. The first region 235a overlapping with the gate electrode 233 functions as a channel region. With the pair of second regions 235b and 235c including dopant, a source-drain breakdown voltage can be increased. The oxide semiconductor film 235 is constituted by the first region 235a and the pair of second regions 235b and 235c including dopant.

Further, the concentration of hydrogen in the first region 235a of the oxide semiconductor film 229 is preferably lower than $5\times10^{18}$ atoms/cm$^3$, further preferably lower than or equal to $1\times10^{18}$ atoms/cm$^3$, still further preferably lower than or equal to $5\times10^{17}$ atoms/cm$^3$, still further preferably lower than or equal to $1\times10^{16}$ atoms/cm$^3$. By a bond of an oxide semiconductor and hydrogen, part of contained hydrogen serves as a donor to generate electrons as carriers. For that reason, by a reduction in the concentration of hydrogen in the first region 235a of the oxide semiconductor film 229, a negative shift of the threshold voltage can be reduced.

The concentration of the dopant in the pair of second regions 235b and 235c is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 235b and 235c include dopant, the carrier density or the number of defects can be increased. Therefore, the conductivity thereof can be higher than that of the first region 235a which does not include dopant. Note that an excessive increase in the concentration of dopant causes inhibition of carrier movement by the dopant, which leads to a reduction in conductivity of the pair of second regions 235b and 235c including dopant.

The pair of second regions 235b and 235c including dopant preferably has a conductivity of higher than or equal to 0.1 S/cm and lower than or equal to 1000 S/cm, preferably higher than or equal to 10 S/cm and lower than or equal to 1000 S/cm.

The existence of the pair of second regions 235b and 235c including dopant in the oxide semiconductor film 229 can relieve an electric field applied to the end portion of the first region 235a functioning as a channel region. Thus, a short-channel effect of the transistor can be suppressed.

The dopant can be added to the oxide semiconductor film 229 by an ion doping method or an ion implantation method. As the dopant, at least one of boron, nitrogen, phosphorus, and arsenic can be added. Alternatively, as the dopant, at least one of helium, neon, argon, krypton, and xenon can be added. Further alternatively, as the dopant, hydrogen can be added. Still alternatively, as the dopant, at least one of boron, nitrogen, phosphorus, and arsenic and at least one of helium, neon, argon, krypton, and xenon in appropriate combination can be added.

In the embodiment describe here, the addition of the dopant to the oxide semiconductor film 229 is conducted in a state where the oxide semiconductor film 229 is covered with the insulating film and the like; alternatively, the addition of the dopant may be conducted in a state where the oxide semiconductor film 229 is exposed.

Alternatively, the dopant can be added by a method other than an ion doping method, an ion implantation method, or the like. For example, a dopant can be added in the following manner: plasma is generated in an atmosphere of a gas containing an element to be added and plasma treatment is performed on an object to which the dopant is added. A dry etching apparatus, a CVD apparatus, or the like can be used to generate the plasma.

After that, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 235b and 235c including dopant can be reduced. In the heat treatment, the pair of second regions 235b and 235c including dopant may be in either a crystalline state or an amorphous state.

Figure 15C:
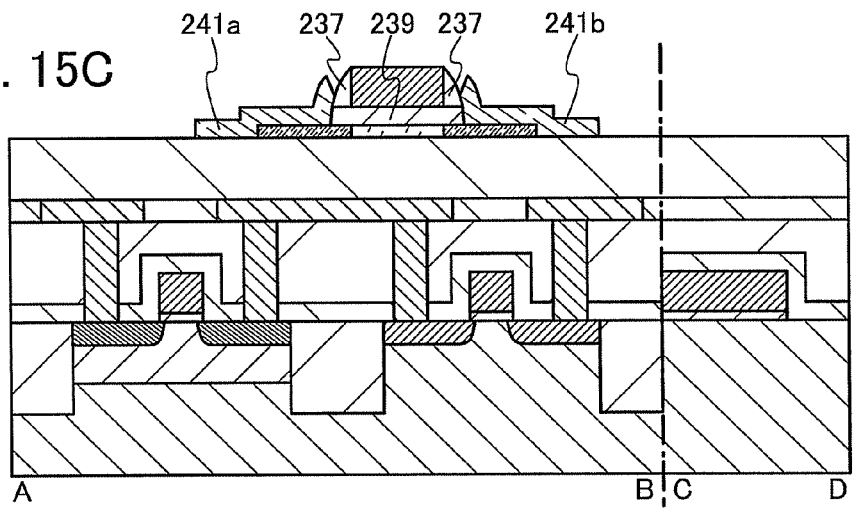

Next, as illustrated in FIG. 15C, sidewall insulating films 237 are formed on side surfaces of the gate electrode 233, and a gate insulating film 239 and electrodes 241a and 241b are formed.

The sidewall insulating films 237 may be, for example, formed with a single layer or a stacked layer using one or more of silicon oxide, silicon oxynitride, silicon nitride oxide, silicon nitride, aluminum oxide, aluminum oxynitride, aluminum nitride oxide, aluminum nitride, and the like. The sidewall insulating films 237 may be formed using an oxide insulating film from which part of oxygen is released by heating in a manner similar to that of the insulating film 225.

A method for forming the sidewall insulating films 237 is described below.

First, an insulating film to be the sidewall insulating films 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of coverage with respect to the shape of the gate electrode 233.

Then, the sidewall insulating films 237 are formed by etching the insulating film. The etching here is highly anisotropic etching, and the sidewall insulating films 237 can be formed in a self-aligned manner by performing the highly anisotropic etching on the insulating film.

The width of the pair of second regions 235b and 235c including dopant depends on the width of the sidewall insulating film 237, and the width of the sidewall insulating film 237 depends on the thickness of the gate electrode 233. Therefore, the thickness of the gate electrode 233 may be determined so that the width of the pair of second regions 235b and 235c has a desired value.

When the sidewall insulating films 237 are formed, the insulating film 251 is also etched by highly anisotropic etching and the oxide semiconductor film 229 is partly exposed, whereby the gate insulating film 239 is formed.

The pair of electrodes 241a and 241b can be formed using a material similar to that of the wirings 223a to 223c, as appropriate. Note that the pair of electrodes 241a and 241b may serve as wirings.

The pair of electrodes 241a and 241b is formed by a printing method or an inkjet method. Alternatively, a conductive film is deposited by a sputtering method, a CVD method, an evaporation method, or the like, and then the part of the conductive film is selectively etched, so that the pair of electrodes 241a and 241b is formed.

The pair of electrodes 241a and 241b is preferably formed to be in contact with the side surfaces of the sidewall insulating films 237 and the gate insulating film 239. That is, end portions of the pair of electrodes 241a and 241b of the transistor are located over the sidewall insulating films 237 and entirely cover exposed portions of the pair of second regions 235b and 235c including dopant in the oxide semiconductor film 229. As a result, regions in the pair of second regions 235b and 235c including dopant which are in contact with the pair of electrodes 241a and 241b serve as a source region and a drain region. In addition, with regions in the pair of second regions 235b and 235c including dopant which overlap with the sidewall insulating films 237 and the gate insulating film 239, a source-drain breakdown voltage can be increased. Further, the distance between a source and a drain can be adjusted depending on the length of the sidewall insulating films 237; thus, end portions of the electrodes 241a and 241b, which are on the channel side and in contact with the oxide semiconductor film 229, can be formed without a mask. Since a mask is not used, differences of shapes among a plurality of transistors generated in processing can be reduced.

Through the above steps, a transistor including an oxide semiconductor film which can be used as the second switch 161 can be manufactured.

Figure 16A:
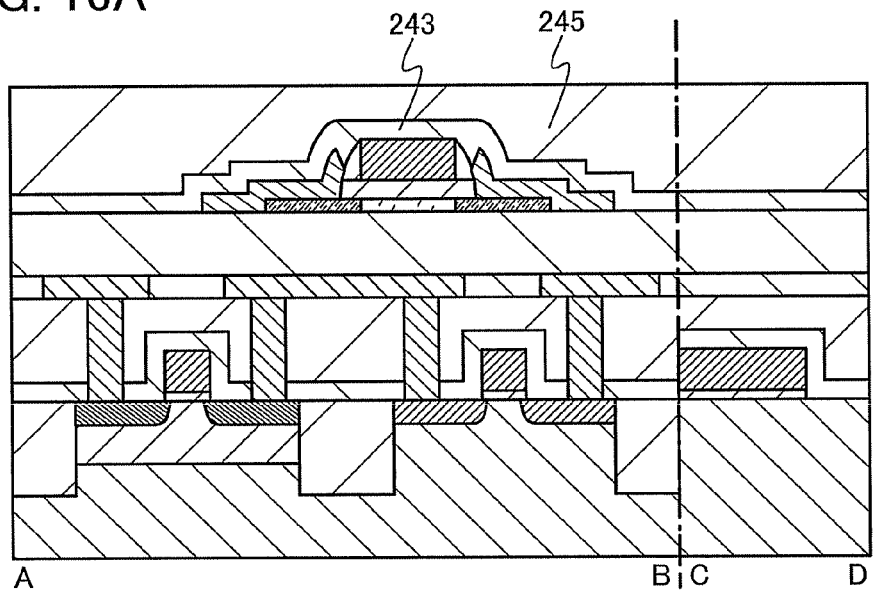
FIGS. 16A and 16B are cross-sectional views illustrating a method for manufacturing the memory device according to one embodiment of the present invention.
Figure 16B:
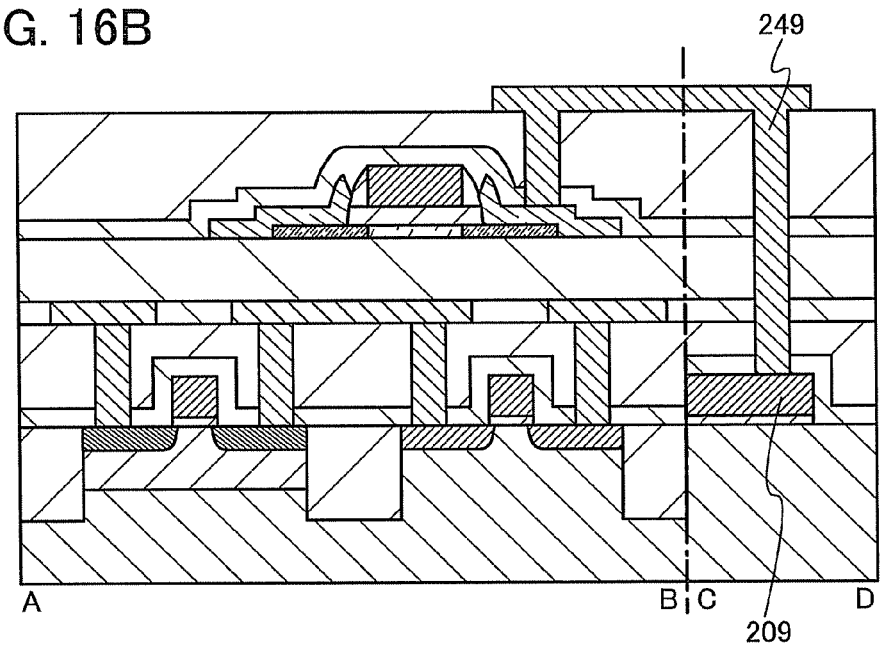

Next, as illustrated in FIG. 16A, an insulating film 243 and an insulating film 245 are formed by a sputtering method, a CVD method, a coating method, a printing method, or the like.

The insulating films 243 and 245 each may be formed to have a single layer or a stacked layer using one or more of silicon oxide, silicon oxynitride, silicon nitride oxide, silicon nitride, aluminum oxide, aluminum oxynitride, aluminum nitride oxide, aluminum nitride, and the like. When the insulating film 245 is formed to function as an insulating film which prevents diffusion of oxygen to the outside, oxygen released from the insulating film 243 can be supplied to the oxide semiconductor film. Typical examples of an insulating film which prevents diffusion of oxygen to the outside include an aluminum oxide film and an aluminum oxynitride film. In addition, by using an insulating film which prevents diffusion of hydrogen from the outside as the insulating film 245, diffusion of hydrogen from the outside to the oxide semiconductor film can be reduced, and deficiency in the oxide semiconductor film can be reduced. Typical examples of the insulating film which prevents diffusion of hydrogen from the outside include films of silicon nitride, silicon nitride oxide, aluminum nitride, and aluminum nitride oxide. Further, the insulating film 243 has a three-layer structure in which an oxide insulating film, like the insulating film 225, from which part of oxygen is released by heating, an insulating film which prevents diffusion of oxygen to the outside, and an oxide insulating film are provided. Thus, oxygen can be efficiently diffused to the oxide semiconductor film, and release of oxygen to the outside can be suppressed. Accordingly, variation in characteristics of transistors can be reduced even at high temperature and at high humidity.

Through the above steps, a transistor including an oxide semiconductor film can be manufactured.

Next, parts of the insulating films 215, 217, 221e, 243, and 245 are each selectively etched to form opening portions, so that the gate electrode 209 and one of the pair of electrodes are partly exposed. Next, a conductive film is formed in the opening portions, and then part of the conductive film is selectively etched to form a wiring 249. The wiring 249 can be formed using a material used for the contact plugs 219a to 219d as appropriate.

Through the above steps, the other of the source and the drain of the first transistor 101 including an oxide semiconductor film can be connected to the gate of the eighth transistor 108 that is an n-channel transistor.

In a memory element included in a memory device, a transistor which includes a channel region formed in an oxide semiconductor film can be stacked over a transistor which includes a semiconductor substrate or a semiconductor film provided over an insulating substrate. As a result, high integration of the memory device can be achieved.

This embodiment can be implemented in appropriate combination with any of the other embodiments.

Embodiment 4

In this embodiment, a method for forming the oxide semiconductor film 229 described in Embodiment 3 using a CAAC-OS will be described.

A first method for forming the oxide semiconductor film 229 using a CAAC-OS is described below.

In the case where a sputtering method is employed in the method for forming the oxide semiconductor film 227 illustrated in FIG. 14B described in Embodiment 3 in forming the oxide semiconductor film 229 using a CAAC-OS, the substrate temperature is set to be higher than or equal to 150° C. and lower than or equal to 450° C., preferably higher than or equal to 200° C. and lower than or equal to 350° C., so that entry of hydrogen, water, and the like to the oxide semiconductor film can be reduced and a CAAC-OS can be formed.

Heat treatment is performed after the oxide semiconductor film is formed using a CAAC-OS by the above-described method, whereby hydrogen, water, and the like can be further released from the oxide semiconductor film 227, part of oxygen contained in the insulating film 225 can be diffused into the oxide semiconductor film 227 and the vicinity of the interface between the insulating film 225 and the oxide semiconductor film 227, and the oxide semiconductor film 228 including a CAAC-OS with a high crystallinity can be formed. Then, part of the oxide semiconductor film 228 is selectively etched, so that the oxide semiconductor film 229 can be farmed.

Next, a second method for forming the oxide semiconductor film 229 using a CAAC-OS is described.

A first oxide semiconductor film is formed over the insulating film 225. The thickness of the first oxide semiconductor film is greater than or equal to a thickness of one atomic layer and less than or equal to 10 nm, preferably greater than or equal to 2 nm and less than or equal to 5 nm.

The first oxide semiconductor film is formed in an oxygen gas atmosphere at a substrate heating temperature higher than or equal to 100° C. and lower than or equal to 600° C., preferably higher than or equal to 150° C. and lower than or equal to 550° C., and further preferably higher than or equal to 200° C. and lower than or equal to 500° C. As the substrate heating temperature at the time of film formation is higher, the impurity concentration of the obtained oxide semiconductor film is lower. Further, entry of impurities such as hydrogen and water in the formed first oxide semiconductor film can be reduced. Further, the atomic arrangement in the oxide semiconductor film is ordered, and the density thereof is increased, so that a polycrystal or a CAAC-OS is readily formed. Furthermore, since an oxygen gas atmosphere is employed for the film formation, an unnecessary atom is not contained in the oxide semiconductor film unlike in the case of employing a rare gas atmosphere or the like, so that a polycrystal or a CAAC-OS is readily formed. Note that a mixed gas atmosphere including an oxygen gas and a rare gas may be used. In that case, the percentage of an oxygen gas is higher than or equal to 30 vol. %, preferably higher than or equal to 50 vol. %, further preferably higher than or equal to 80 vol. %. As the oxide semiconductor film is thinner, the short channel effect of the transistor can be reduced. However, when the oxide semiconductor film is too thin, the oxide semiconductor film is significantly influenced by interface scattering; thus, the field effect mobility might be decreased.

After the first oxide semiconductor film is formed, first heat treatment may be performed. Through the first heat treatment, hydrogen, water, and the like can be removed from the first oxide semiconductor film, and the crystallinity thereof can be further improved. By the first heat treatment, a CAAC-OS film with high orientation can be formed. The first heat treatment is performed at a temperature higher than or equal to 200° C. and lower than the strain point of the substrate, preferably higher than or equal to 250° C. and lower than or equal to 450° C.

For the first heat treatment, a rapid thermal annealing (RTA) apparatus can be used. With use of the RTA apparatus, only in a short time, the heat treatment can be performed at a temperature higher than or equal to the strain point of the substrate. Therefore, time to form an oxide semiconductor film in which the proportion of a crystalline region is higher than that of an amorphous region can be shortened.

The first heat treatment can be performed in an inert gas atmosphere; preferably, in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is three minutes to 24 hours. As the treatment time is increased, the proportion of a crystal region with respect to that of an amorphous region in the oxide semiconductor film can be increased. Note that heat treatment for longer than 24 hours is not preferable because the productivity is decreased.

Next, a second oxide semiconductor film is formed over the first oxide semiconductor film. The second oxide semiconductor film can be formed by a method similar to that for the first oxide semiconductor film.

When the substrate is heated while the second oxide semiconductor film is formed, the second oxide semiconductor film can be crystallized with use of the first oxide semiconductor film as a seed crystal. At this time, the formation of the first oxide semiconductor film and the second oxide semiconductor film both including the same element is referred to as "homoepitaxial growth". The formation of the first oxide semiconductor film and the second oxide semiconductor film including at least one different element from each other is referred to as "heteroepitaxial growth".

After formation of the second oxide semiconductor film, second heat treatment may be performed. The second heat treatment may be performed in a manner similar to that of the first heat treatment. By the second heat treatment, an oxide semiconductor film in which the proportion of a crystalline region is higher than that of an amorphous region can be formed. Alternatively, with the second heat treatment, the second oxide semiconductor film can be crystallized using the first oxide semiconductor film as a seed crystal.

As described above, after the oxide semiconductor film 227 is formed using a CAAC-OS in which entry of hydrogen, water, and the like is reduced, heat treatment is performed, whereby hydrogen, water, and the like is released from the oxide semiconductor film 227, and part of oxygen contained in the insulating film 225 can be diffused to the oxide semiconductor film 227 and in the vicinity of interface between the insulating film 225 and the oxide semiconductor film 227. Thus, by the heat treatment, the oxide semiconductor film 228 with high crystallinity can be formed using a CAAC-OS. Then, part of the oxide semiconductor film 228 is selectively etched, so that the oxide semiconductor film 229 can be formed.

Hydrogen contained in the oxide semiconductor is reacted with oxygen bonded to a metal atom to be water, and in addition, a vacancy is formed in a lattice from which oxygen is eliminated (or a portion from which oxygen is removed). Thus, impurities are reduced as much as possible in the formation step of the oxide semiconductor film, whereby vacancies in the oxide semiconductor film can be reduced. Therefore, by using an oxide semiconductor film which is a CAAC-OS film that is highly purified through removal of the impurities as much as possible for a channel region, the amount of change in threshold voltage of the transistor before and after light irradiation or the BT (bias temperature) stress test is small, whereby the transistor can have stable electric characteristics.

This embodiment can be implemented in appropriate combination with any of the other embodiments.

Embodiment 5

In this embodiment, the field-effect mobility of a transistor that uses an oxide semiconductor film for a channel region will be described.

The actually measured field-effect mobility of a transistor can be lower than its intrinsic field-effect mobility because of a variety of reasons; this phenomenon occurs not only in the case of using an oxide semiconductor. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the field-effect mobility $\mu$ can be expressed as Formula 2 shown below.

$$\mu = \mu_0 \exp\left(-\frac{E}{kT}\right) \qquad \text{[Formula 2]}$$

Here, E represents the height of the potential barrier, k represents the Boltzmann constant, and T represents the absolute temperature. When the potential barrier is assumed to be attributed to a defect, the height of the potential barrier (E) can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor film is less than or equal to 30 nm, the thickness of the channel may be regarded as being the same as the thickness of the semiconductor film. The drain current $I_d$ in a linear region can be expressed as the following formula.

$$I_d = \frac{W\mu V_g V_d C_{ox}}{L} \exp\left(-\frac{E}{kT}\right) \qquad \text{[Formula 4]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the drain current $I_d$ is expressed as the following formula.

$$\ln\left(\frac{I_d}{V_g}\right) = \ln\left(\frac{W\mu V_d C_{ox}}{L}\right) - \frac{E}{kT} \qquad \text{[Formula 5]}$$

$$= \ln\left(\frac{W\mu V_d C_{ox}}{L}\right) - \frac{e^3 N^2 t}{8kT\varepsilon C_{ox} V_g}$$

The right side of the Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, or the like, $\mu_0$ can be calculated to be 120 cm$^2$/Vs from Formula 2 and Formula 3. The measured field-effect mobility of an In—Sn—Zn oxide including a defect is approximately 40 cm$^2$/Vs. However, assuming that no defect exists inside the semiconductor and at the interface between the semiconductor and an insulating film, the filed-effect mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the field-effect mobility $\mu_0$ at a position that is distance x away from the interface between the semiconductor and the gate insulating film can be expressed as the following formula.

$$\frac{1}{\mu_1} = \frac{1}{\mu_0} + \frac{D}{B}\exp\left(-\frac{x}{G}\right) \qquad \text{[Formula 6]}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 6 is increased and accordingly the field-effect mobility $\mu_1$ is decreased.

Figure 21:
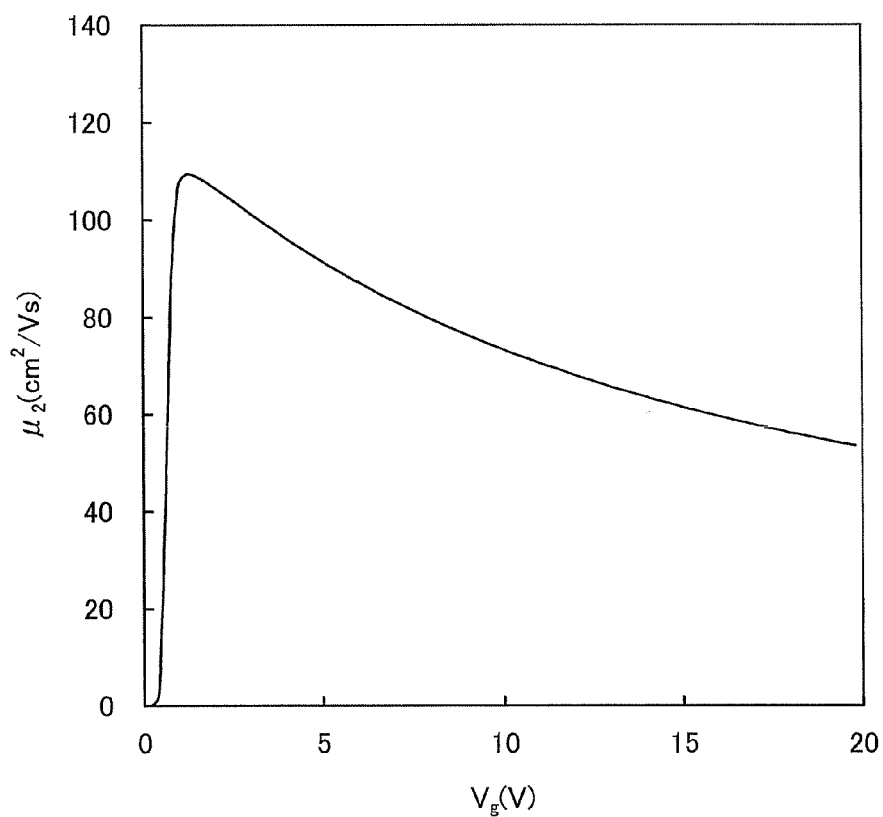
FIG. 21 shows the gate voltage dependence of field-effect mobility obtained by calculation.

Calculation results of the field-effect mobility $\mu_2$ of a transistor whose channel is formed using an ideal oxide semiconductor film without a defect inside the semiconductor are shown in FIG. 21. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 21, the field-effect mobility has a peak of more than 100 cm$^2$/Vs at a gate voltage that is a little over 1 V and is decreased as the gate voltage becomes higher because the influence of interface scattering is increased. Note that in order to reduce interface scattering, it is preferable that a surface of the semiconductor film be flat at the atomic level (atomic layer flatness).

Calculation results of characteristics of minute transistors which are manufactured using an oxide semiconductor having such a filed-effect mobility are shown in FIGS. 22A to 22C, FIGS. 23A to 23C, and FIGS. 24A to 24C. FIGS. 25A and 25B illustrate cross-sectional structures of transistors used for calculation. In each of the transistors illustrated in FIGS. 25A and 25B, an n-type impurity semiconductor region 1103a and an n-type impurity semiconductor region 1103c are included in an oxide semiconductor film. The resistivities of the impurity semiconductor region 1103a and the impurity semiconductor region 1103c are $2 \times 10^{-3}$ Ωcm.

The transistor in FIG. 25A is formed over a base insulating film 1101 and an embedded insulator 1102 that is embedded in the base insulating film 1101 and formed of aluminum oxide. The transistor includes the impurity semiconductor region 1103a, the impurity semiconductor region 1103c, an intrinsic semiconductor region 1103b functioning as a channel formation region therebetween, and a gate electrode 1105. The width of the gate electrode 1105 (that is, the channel length) is 33 nm.

A gate insulating film 1104 is formed between the gate electrode 1105 and the semiconductor region 1103b. In addition, a sidewall insulating film 1106a and a sidewall insulating film 1106b are formed on both side surfaces of the gate electrode 1105, and an insulator 1107 is formed over the gate electrode 1105 so as to prevent a short circuit between the gate electrode 1105 and another wiring. The sidewall insulating film has a width of 5 nm. A source electrode 1108a and a drain electrode 1108b are provided in contact with the impurity semiconductor region 1103a and the impurity semiconductor region 1103c, respectively. Note that the channel width of this transistor is 40 nm.

The transistor of FIG. 25B is the same as the transistor of FIG. 25A in that it is formed over the base insulating film 1101 and the embedded insulator 1102 formed of aluminum oxide and that it includes the impurity semiconductor region 1103a, the impurity semiconductor region 1103c, the intrinsic semiconductor region 1103b provided therebetween, the gate electrode 1105 having a width of 33 nm, the gate insulating film 1104, the sidewall insulating film 1106a, the sidewall insulating film 1106b, the insulator 1107, the source electrode 1108a, and the drain electrode 1108b.

The transistor illustrated in FIG. 25A is different from the transistor illustrated in FIG. 25B in the conductivity type of semiconductor regions under the sidewall insulating film 1106a and the sidewall insulating film 1106b. In the transistor illustrated in FIG. 25A, the semiconductor regions under the sidewall insulating film 1106a and the sidewall insulating film 1106b are part of the n-type impurity semiconductor region 1103a and part of the n-type semiconductor region 1103c, whereas in the transistor illustrated in FIG. 25B, the semiconductor regions under the sidewall insulating film 1106a and the sidewall insulating film 1106b are part of the intrinsic semiconductor region 1103b. In other words, a region having a width $L_{off}$ which overlaps with neither the impurity semiconductor region 1103a (the impurity semiconductor region 1103c) nor the gate electrode 1105 is provided. This region is called an offset region, and the width $L_{off}$ is called an offset length. As is seen from the drawing, the offset length is equal to the width of the sidewall insulating film 1106a (the sidewall insulating film 1106b).

Figure 22A:
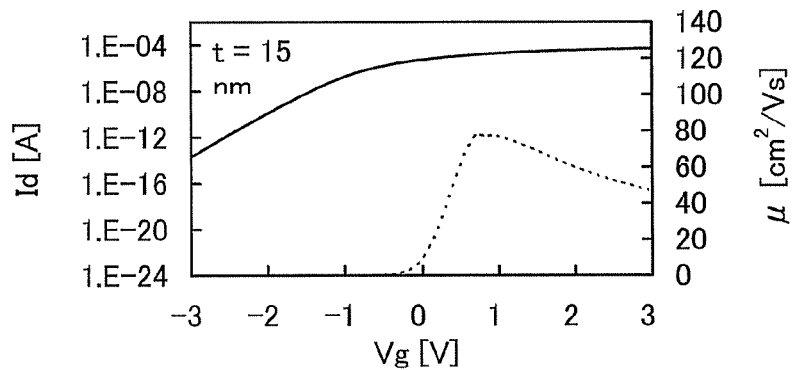
FIGS. 22A to 22C each show the gate voltage dependence of drain current and field-effect mobility obtained by calculation.
Figure 22B:
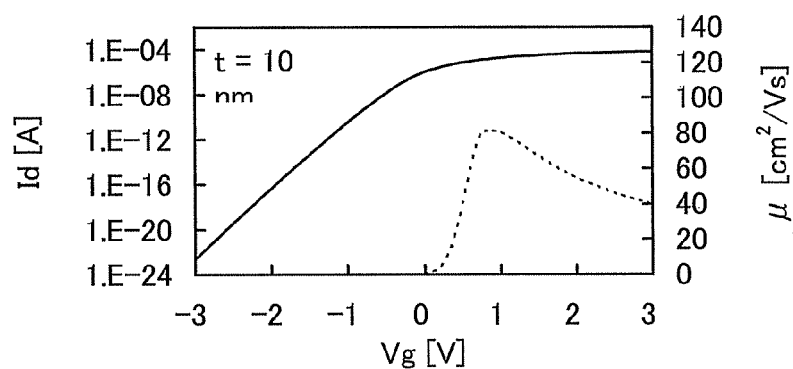
Figure 22C:
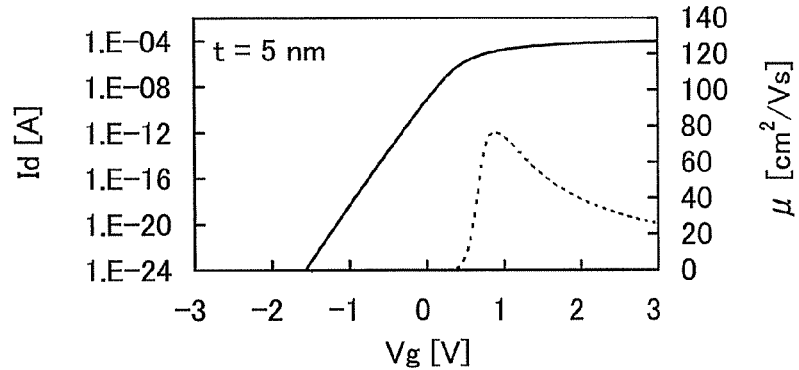

The other parameters used in calculation are as described above. For the calculation, device simulation software Sentaurus Device manufactured by Synopsys, Inc. was used. FIGS. 22A to 22C show the gate voltage $V_g$ (a potential difference between the gate and the source) dependence of the drain current $I_d$ (a solid line) and the field-effect mobility μ (a dotted line) of the transistor having the structure illustrated in FIG. 25A. The drain current $I_d$ is obtained by calculation under the assumption that the drain voltage (a potential difference between the drain and the source) is +1 V and the field-effect mobility μ is obtained by calculation under the assumption that the drain voltage is +0.1 V.

FIG. 22A shows the gate voltage dependence of the transistor in the case where the thickness of the gate insulating film is 15 nm, FIG. 22B shows that of the transistor in the case where the thickness of the gate insulating film is 10 nm, and FIG. 22C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility μ and the drain current $I_d$ in an on state (on-state current). The graphs show that the drain current exceeds 10 μA at a gate voltage of around 1 V. In other words, the value of the on-state current required for an LSI can be satisfied.

Figure 23A:
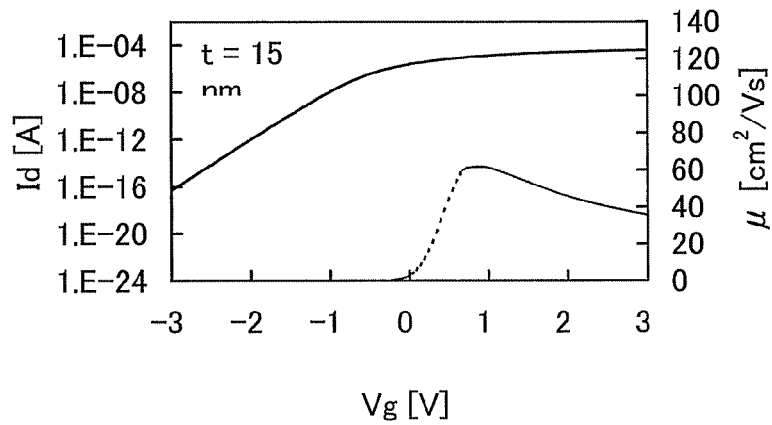
FIGS. 23A to 23C each show the gate voltage dependence of drain current and field-effect mobility obtained by calculation.
Figure 23B:
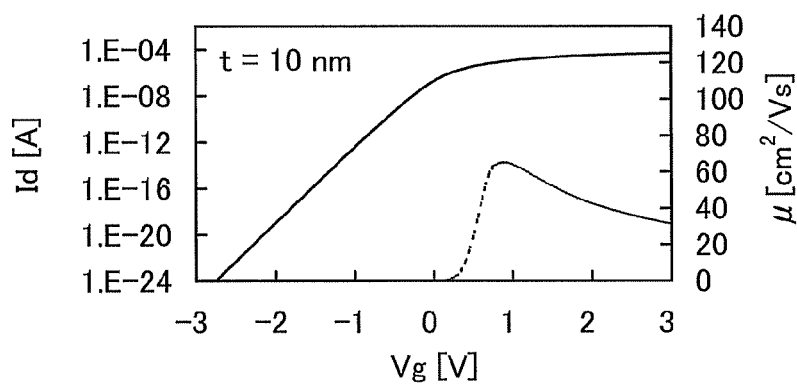
Figure 23C:
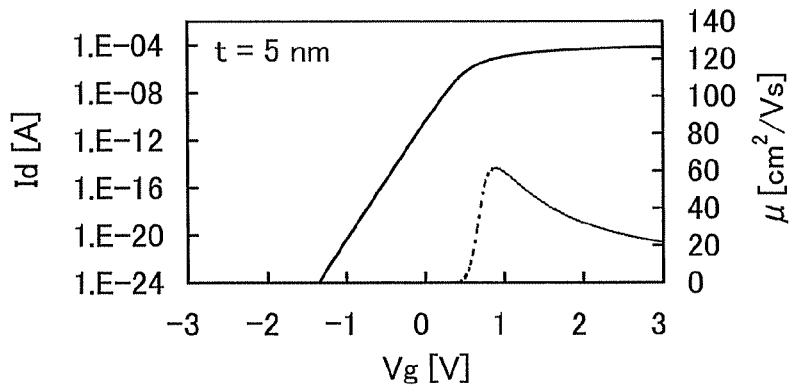

FIGS. 23A to 23C show the gate voltage $V_g$ dependence of the drain current $I_d$ (a solid line) and the field-effect mobility μ (a dotted line) of the transistor having the structure illustrated in FIG. 25B where the offset length $L_{off}$ is 5 nm. The drain current $I_d$ is obtained by calculation under the assumption that the drain voltage is +1 V and the field-effect mobility μ is obtained by calculation under the assumption that the drain voltage is +0.1 V. FIG. 23A shows the gate voltage dependence of the transistor in the case where the thickness of the gate insulating film is 15 nm, FIG. 23B shows that of the transistor in the case where the thickness of the gate insulating film is 10 nm, and FIG. 23C shows that of the transistor in the case where the thickness of the gate insulating film is 5 nm.

Figure 24A:
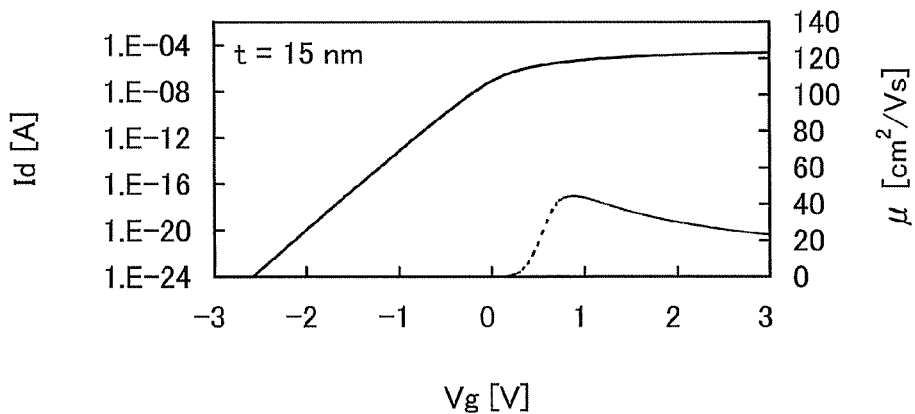
FIGS. 24A to 24C each show the gate voltage dependence of drain current and field-effect mobility obtained by calculation.
Figure 24B:
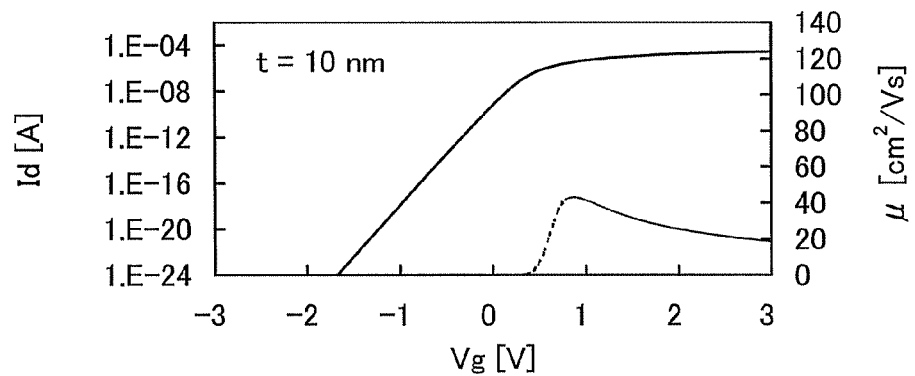
Figure 24C:
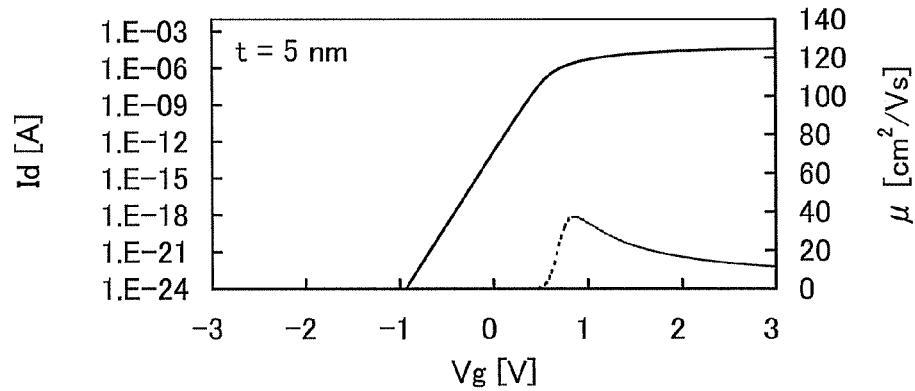
Figure 25A:
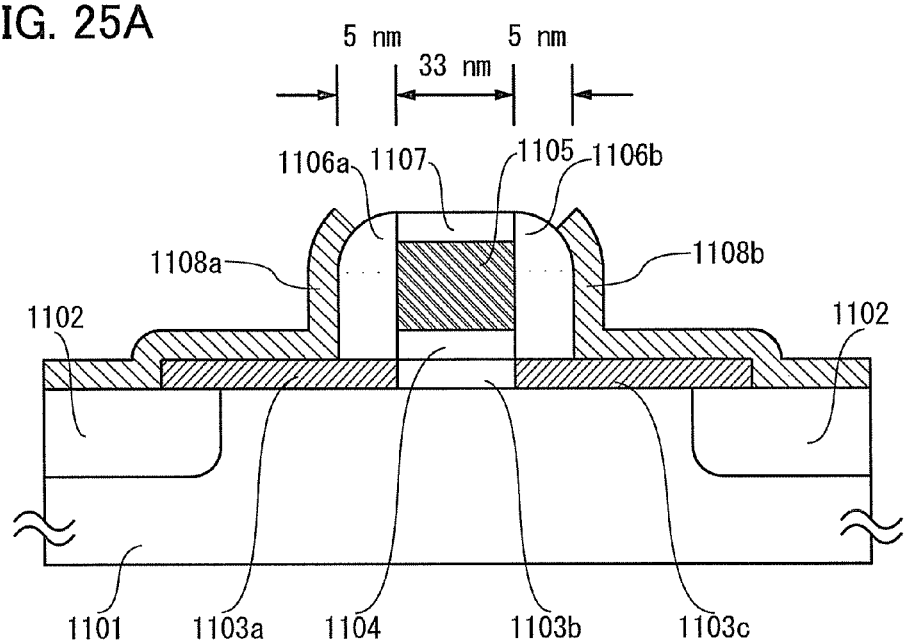
FIGS. 25A and 25B each illustrate a cross-sectional structure of a transistor used for calculation.
Figure 25B:
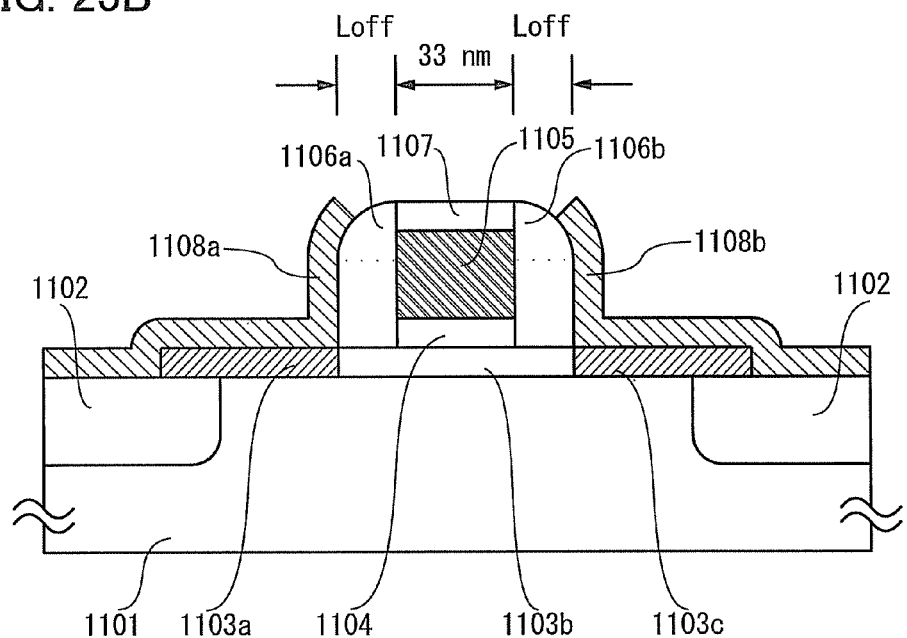

Further, FIGS. 24A to 24C show the gate voltage dependence of the drain current $I_d$ (a solid line) and the field-effect mobility μ (a dotted line) of the transistor having the structure illustrated in FIG. 25B where the offset length $L_{off}$ is 15 nm. The drain current $I_d$ is obtained by calculation under the assumption that the drain voltage is +1 V and the field-effect mobility μ is obtained by calculation under the assumption that the drain voltage is +0.1 V. FIG. 24A shows the gate voltage dependence of the transistor in the case where the thickness of the gate insulating film is 15 nm, FIG. 24B shows that of the transistor in the case where the thickness of the gate insulating film is 10 nm, and FIG. 24C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility μ and the on-state current.

Note that the peak of the field-effect mobility μ is approximately 80 cm$^2$/Vs in FIGS. 22A to 22C, approximately 60 cm$^2$/Vs in FIGS. 23A to 23C, and approximately 40 cm$^2$/Vs in FIGS. 24A to 24C; thus, the peak of the field-effect mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA at a gate voltage of around 1 V. In other words, the value of the on-state current required for an LSI can be satisfied.

Example 1

In this example, electric characteristics and reliability of a transistor in which an oxide semiconductor film including In, Sn, and Zn as main components is used for a channel region will be described.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 at. % or more.

By intentionally heating the substrate during forming the oxide semiconductor film or after formation of the oxide semiconductor film including In, Sn, and Zn as main components, the field-effect mobility of the transistor can be improved. Further, the threshold voltage of the transistor can be positively shifted to make the transistor normally off.

Figure 26A:
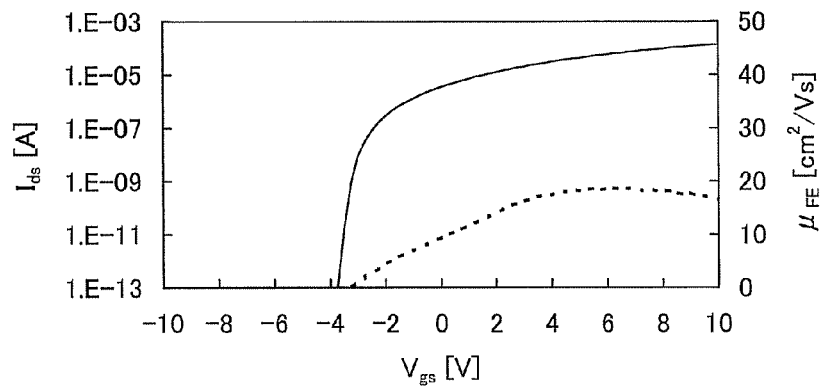
FIGS. 26A to 26C each show the gate voltage dependence of drain current and field-effect mobility in a transistor including an oxide semiconductor film.
Figure 26B:
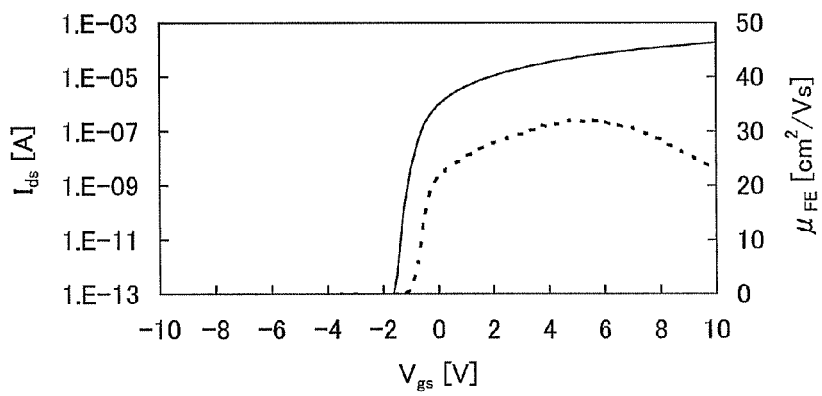
Figure 26C:
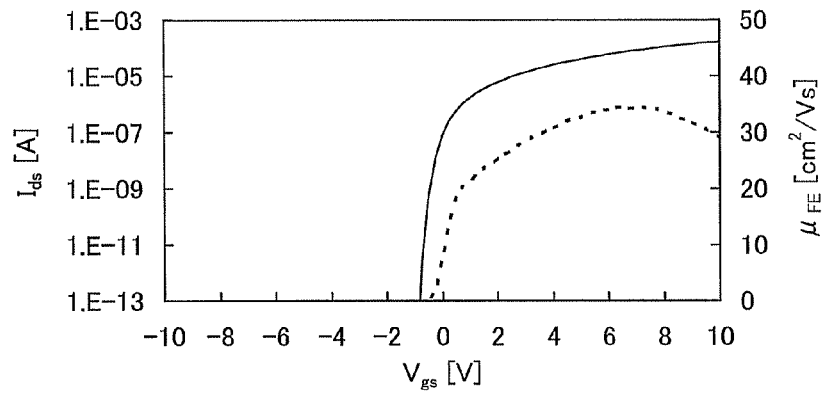

As an example, FIGS. 26A to 26C are graphs each showing characteristics of a transistor in which an oxide semiconductor film including In, Sn, and Zn as main components and having a channel length L of 3 μm and a channel width W of 10 μm, and a gate insulating film with a thickness of 100 nm are used. Note that $V_{ds}$ was set to 10 V.

FIG. 26A shows characteristics of a transistor whose oxide semiconductor film including In, Sn, and Zn as main components was formed by a sputtering method without heating a substrate intentionally. The field-effect mobility of the transistor is 18.8 cm$^2$/Vs. On the other hand, when the oxide semiconductor film including In, Sn, and Zn as main components is formed while heating the substrate intentionally, the field-effect mobility can be improved. FIG. 26B shows characteristics of a transistor whose oxide semiconductor film including In, Sn, and Zn as main components was formed while heating a substrate at 200° C. The field-effect mobility of the transistor is 32.2 cm$^2$/Vs.

The field-effect mobility can be further improved by performing heat treatment after formation of the oxide semiconductor film including In, Sn, and Zn as main components. FIG. 26C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vs.

The intentional heating of the substrate is expected to have an effect of reducing water taken into the oxide semiconductor film during the formation by sputtering. Further, the heat treatment after film formation enables hydrogen, a hydroxyl group, or water to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a purified non-single-crystal oxide semiconductor, it is expected that ideally, a field-effect mobility exceeding 100 cm$^2$/Vs is obtained.

The oxide semiconductor including In, Sn, and Zn as main components may be crystallized in the following manner: oxygen ions are implanted into the oxide semiconductor, hydrogen, a hydroxyl group, or water included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The heating of the substrate during film formation and/or the heat treatment after the film formation contribute(s) not only to improvement of the field-effect mobility but also to make the transistor a normally-off transistor. In a transistor in which an oxide semiconductor film including In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be verified on the basis of comparison between FIGS. 26A and 26B.

Note that the threshold voltage can also be adjusted by changing the ratio of In, Sn, and Zn: when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be lower than ±1.5 V, preferably lower than ±1.0 V.

A BT (bias-temperature) test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$-$I_{ds}$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, $V_{gs}$ of 20 V was applied so that the intensity of an electric field applied to the gate insulating film was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT stress test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, −20 V of $V_{gs}$ was applied so that the intensity of an electric field applied to the gate insulating film was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT stress test.

Figure 27A:
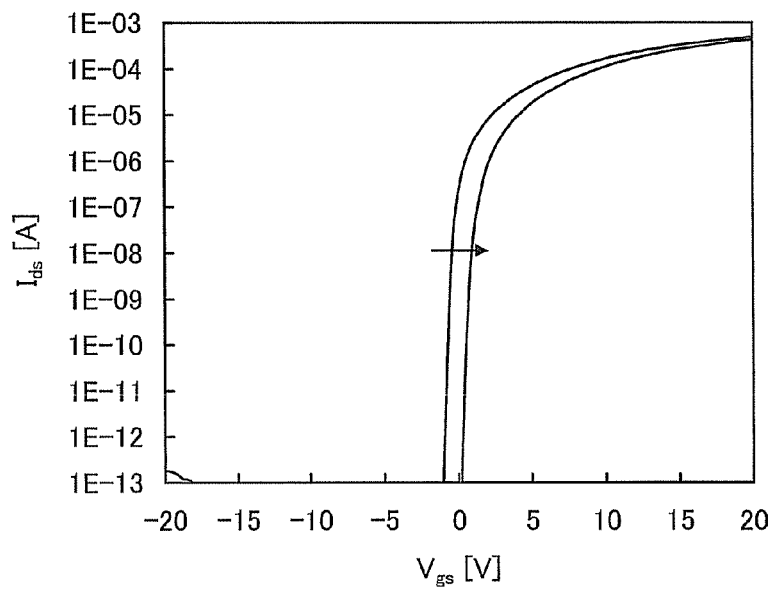
FIGS. 27A and 27B are graphs each showing the drain current of a transistor of Sample 1 after the BT stress test is performed.
Figure 27B:
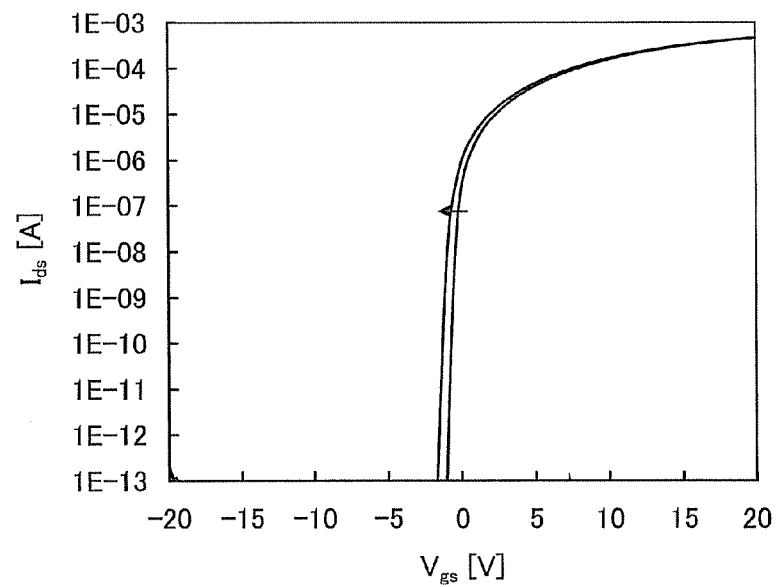
Figure 28A:
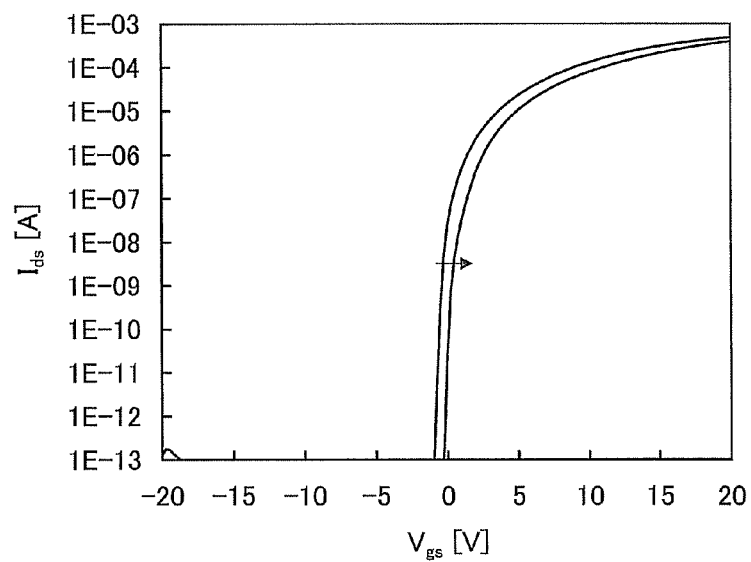
FIGS. 28A and 28B are graphs each showing the drain current of a transistor of Sample 2 after the BT stress test is performed.
Figure 28B:
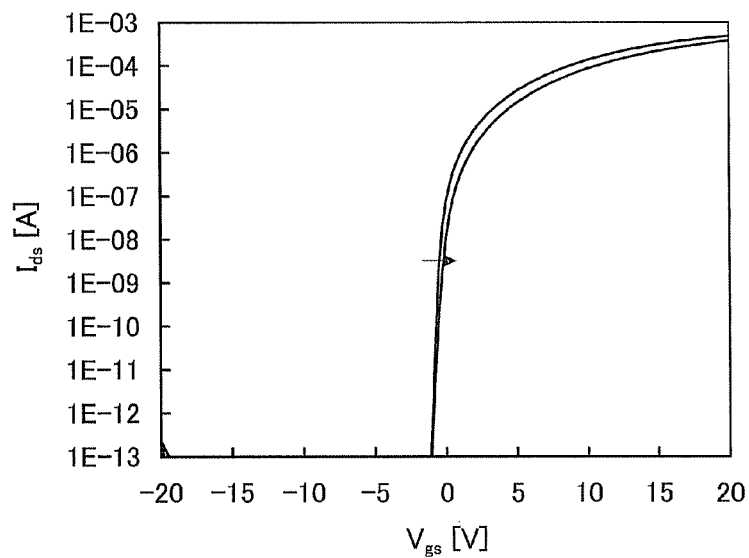

FIGS. 27A and 27B show a result of the positive BT stress test of Sample 1 and a result of the negative BT stress test of Sample 1, respectively. FIGS. 28A and 28B show a result of the positive BT stress test of Sample 2 and a result of the negative BT stress test of Sample 2, respectively.

The amounts of shift in the threshold voltage of Sample 1 due to the positive BT stress test and that due to the negative BT stress test were 1.80 V and −0.42 V, respectively. The amount of shift in the threshold voltage of Sample 2 due to the positive BT stress test and that due to the negative BT stress test were 0.79 V and 0.76 V, respectively. It is found that, in each of Sample 1 and Sample 2, the amount of shift in the threshold voltage between before and after the BT stress tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio, In:Sn:Zn=1:1:1, without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target in which In:Sn:Zn=1:1:1 [atomic ratio] was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 29:
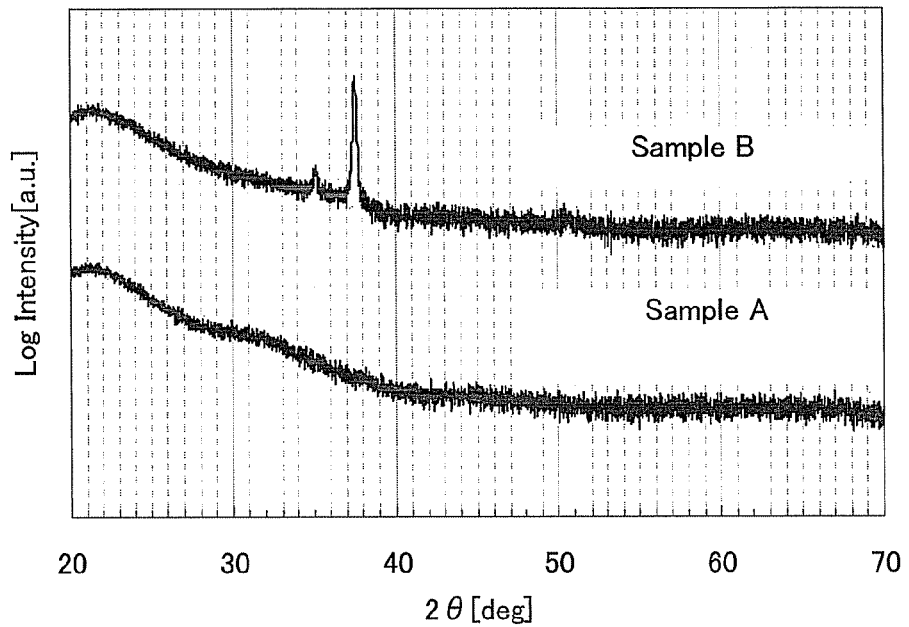
FIG. 29 is a graph showing XRD spectra of Sample A and Sample B.

FIG. 29 shows XRD spectra of Sample A and Sample B. No peak derived from crystal was observed in Sample A, whereas peaks derived from crystal were observed when 20 was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen, a hydroxyl group, water, and the like, which are unfavorable impurities for an oxide semiconductor, from being included in the film or an effect of removing hydrogen, a hydroxyl group, water, and the like from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 30:
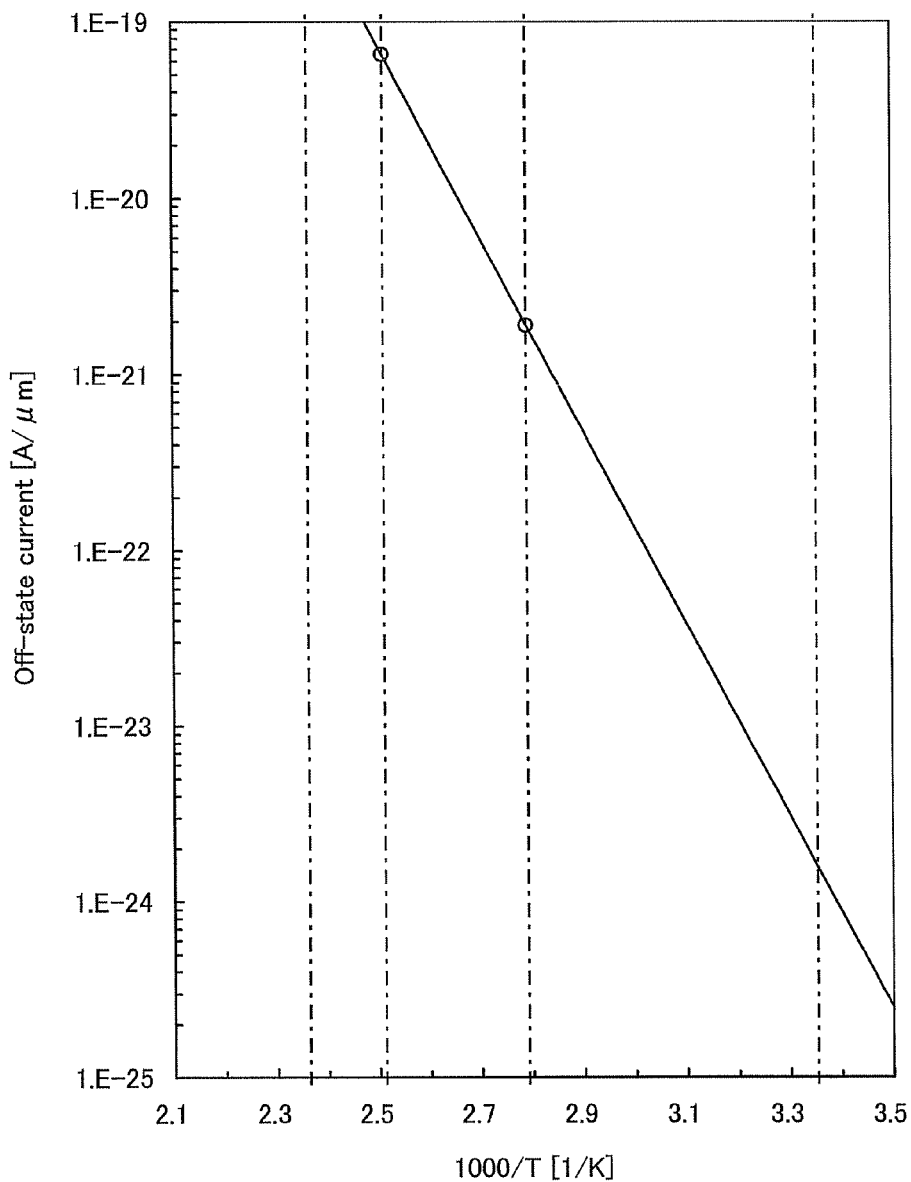
FIG. 30 is a graph showing a relation between the off-state current of a transistor and a substrate temperature in measurement.

FIG. 30 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 30, the off-state current was 0.1 aA/μm ($1 \times 10^{-19}$ A/μm) or smaller and 10 zA/μm ($1 \times 10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1 \times 10^{-22}$ A/μm) or smaller. Hence, the off-state current can be 1 aA/μm ($1 \times 10^{-18}$ A/μm) or smaller, 100 zA/μm ($1 \times 10^{-19}$ A/μm) or smaller, and 1 zA/μm ($1 \times 10^{-21}$ A/μm) or smaller at 125° C., 85° C., and room temperature, respectively.

Note that in order to prevent hydrogen, water, and the like from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent water from being included in the film. In addition, it is preferable to use a target which is highly purified so as not to include impurities such as hydrogen, water, and the like. Although it is possible to remove water from a film of an oxide semiconductor including In, Sn, and Zn as main components by heat treatment, a film which does not include water originally is preferably formed because water is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, $L_{ov}$ of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as $L_{ov}$, and the width of a portion of the pair of electrodes, which does not overlap with an oxide semiconductor film, is referred to as dW.

Figure 31:
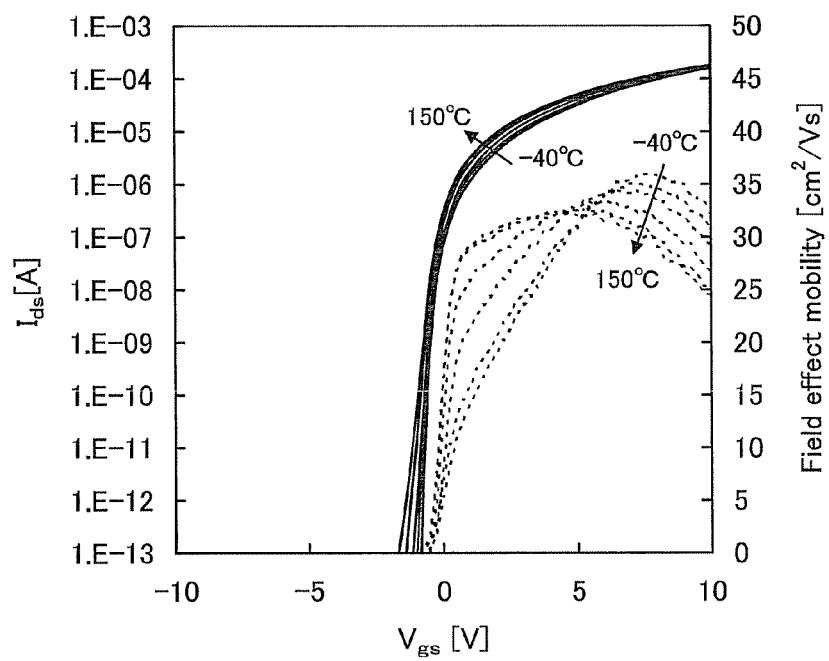
FIG. 31 is a graph showing the gate voltage dependence of drain current and field-effect mobility.
Figure 32A:
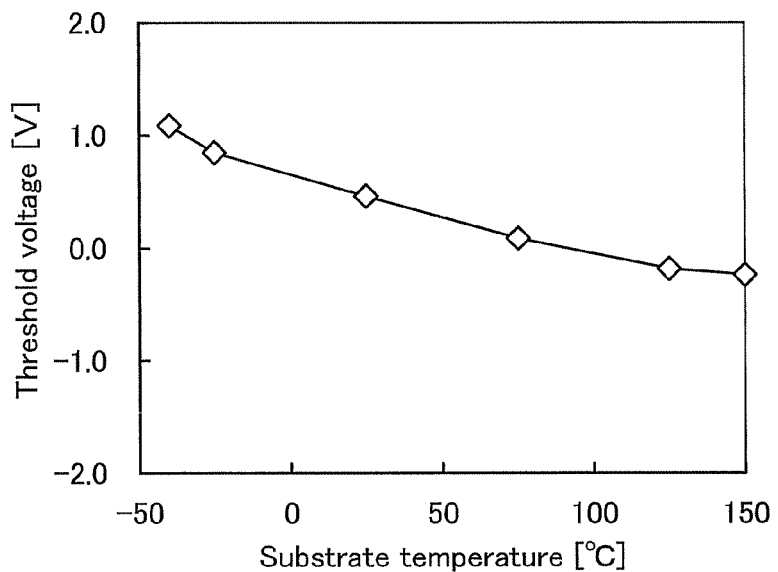
FIG. 32A is a graph showing a relation between the threshold voltage and the substrate temperature and FIG. 32B is a graph showing a relation between the field-effect mobility and the substrate temperature.

FIG. 31 shows the $V_{gs}$ dependence of $I_{ds}$ (a solid line) and field-effect mobility (a dotted line). FIG. 32A shows a relation between the threshold voltage and the substrate temperature, and FIG. 32B shows a relation between the field-effect mobility and the substrate temperature.

From FIG. 32A, it is found that the threshold voltage gets lower as the substrate temperature increases. Note that the threshold voltage is decreased from 1.09 V to −0.23 V in the range from −40° C. to 150° C.

Figure 32B:
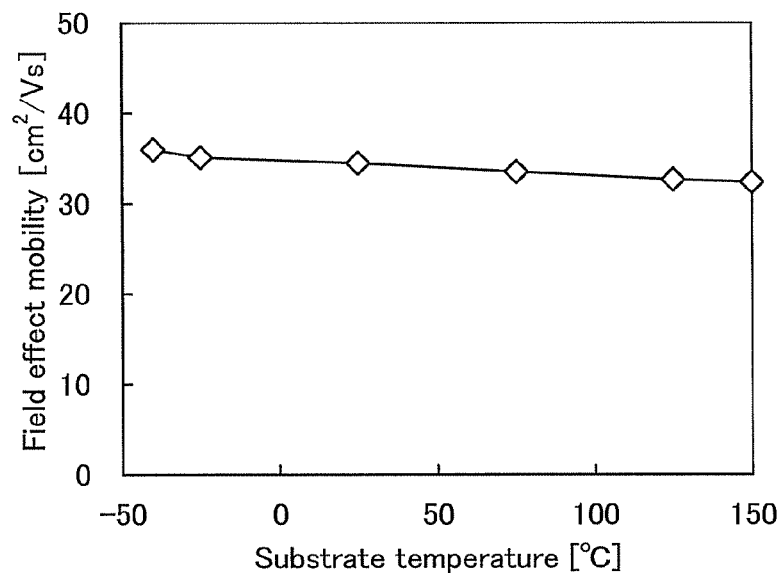

From FIG. 32B, it is found that the field-effect mobility gets lower as the substrate temperature increases. Note that the field-effect mobility is decreased from 36 $cm^2$/Vs to 32 $cm^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 $cm^2$/Vs or higher, preferably 40 $cm^2$/Vs or higher, further preferably 60 $cm^2$/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be obtained without decreasing the operation speed even when a transistor including an oxide semiconductor is also provided in an integrated circuit formed using a silicon semiconductor.

This example can be implemented in appropriate combination with any of the above embodiments.

This application is based on Japanese Patent Application serial no. 2011-113968 filed with Japan Patent Office on May 20, 2011, the entire contents of which are hereby incorporated by reference.

What is claimed is:

1. A memory device comprising:
   a level shifter comprising:
      a first input terminal;
      a second input terminal;
      a first output terminal configured to output a first signal; and
      a second output terminal configured to output an inverted signal of the first signal;
   a first buffer comprising:
      a third input terminal electrically connected to the first output terminal;
      a fourth input terminal electrically connected to the second output terminal; and
      a third output terminal electrically connected to the second input terminal; and
   a second buffer comprising:
      a fifth input terminal electrically connected to the second output terminal;
      a sixth input terminal electrically connected to the first output terminal; and
      a fourth output terminal electrically connected to the first input terminal,
   wherein a first node, where the third output terminal of the first buffer and the first input terminal of the level shifter are connected, is configured to hold a first data, and
   wherein a second node, where the fourth output terminal of the second buffer and the second input terminal of the level shifter are connected, is configured to hold a second data.

2. The memory device according to claim 1, wherein each of the first buffer and the second buffer comprises two transistors in each of which a channel region is formed in an oxide semiconductor film.

3. The memory device according to claim 1, wherein the first data is inverted data of the second data.

4. A semiconductor device comprising the memory device according to claim 1.

5. The semiconductor device according to claim A, further comprising an external device,
   wherein the first input terminal is configured to input a first input signal from the external device and to output a first output signal to the external device, and
   wherein the second input terminal is configured to input a second input signal from the external device and to output a second output signal to the external device.

6. The semiconductor device according to claim 5,
   wherein the external device is configured to output the first input signal and the second input signal to the level shifter at the same time, and
   wherein the level shifter is configured to output the first output signal and the second output signal to the external device at the same time.

7. A memory device comprising:
   a first buffer comprising a first transistor and a second transistor;
   a second buffer comprising a third transistor and a fourth transistor;
   a level shifter comprising a fifth transistor, a sixth transistor, a seventh transistor, and an eighth transistor;
   a first node where a gate of the sixth transistor is connected to one of a source and a drain of the third transistor and to one of a source and a drain of the fourth transistor; and
   a second node where a gate of the eighth transistor is connected to one of a source and a drain of the first transistor and to one of a source and a drain of the second transistor,
   wherein a gate of the first transistor, a gate of the fourth transistor, a gate of the seventh transistor, one of a source and a drain of the fifth transistor, and one of a source and a drain of the sixth transistor are connected to a first input terminal of the level shifter,
   wherein a gate of the second transistor, a gate of the third transistor, a gate of the fifth transistor, one of a source and a drain of the seventh transistor, and one of a source and a drain of the eighth transistor are connected to a second input terminal of the level shifter,
   wherein the first node is configured to hold a first data, and
   wherein the second node is configured to hold a second data.

8. The memory device according to claim 7,
   wherein each of the first transistor to the fourth transistor is a transistor in which a channel region is formed in an oxide semiconductor film,
   wherein the fifth transistor and the seventh transistor have a first conductivity type, and
   wherein the sixth transistor and the eighth transistor have a second conductivity type opposite to the first conductivity type.

9. The memory device according to claim 7,
   wherein the other of the source and the drain of each of the first transistor, the third transistor, the fifth transistor, and the seventh transistor is connected to a wiring for supplying high power supply potential, and
   wherein the other of the source and the drain of each of the second transistor, the fourth transistor, the sixth transistor, and the eighth transistor is connected to a wiring for supplying low power supply potential.

10. The memory device according to claim 7, wherein the first data is inverted data of the second data.

11. A semiconductor device comprising the memory device according to claim 7.

12. The semiconductor device according to claim 11, further comprising an external device,
wherein the first input terminal is configured to input a first input signal from the external device and to output a first output signal to the external device, and
wherein the second input terminal is configured to input a second input signal from the external device and to output a second output signal to the external device.

13. The semiconductor device according to claim 12,
wherein the external device is configured to output the first input signal and the second input signal to the level shifter at the same time, and
wherein the level shifter is configured to output the first output signal and the second output signal to the external device at the same time.

14. A memory device comprising:
a first buffer comprising a first transistor and a second transistor;
a second buffer comprising a third transistor and a fourth transistor;
a level shifter comprising a fifth transistor, a sixth transistor, a seventh transistor, an eighth transistor, a ninth transistor, and a tenth transistor;
a first node where a gate of the sixth transistor and a gate of the seventh transistor are connected to one of a source and a drain of the third transistor and one of a source and a drain of the fourth transistor; and
a second node where a gate of the ninth transistor and a gate of the tenth transistor are connected to one of a source and a drain of the first transistor and one of a source and a drain of the second transistor,
wherein a gate of the first transistor, a gate of the fourth transistor, a gate of the eighth transistor, one of a source and a drain of the sixth transistor, and one of a source and a drain of the seventh transistor are connected to a first input terminal of the level shifter,
wherein a gate of the second transistor, a gate of the third transistor, a gate of the fifth transistor, one of a source and a drain of the ninth transistor, and one of a source and a drain of the tenth transistor are connected to a second input terminal of the level shifter,
wherein the first node is configured to hold a first data, and
wherein the second node is configured to hold a second data.

15. The memory device according to claim 14,
wherein each of the first transistor to the fourth transistor is a transistor in which a channel region is formed in an oxide semiconductor film,
wherein the fifth transistor, the sixth transistor, the eighth transistor, and the ninth transistor have a first conductivity type, and
wherein the seventh transistor and the tenth transistor have a second conductivity type opposite to the first conductivity type.

16. The memory device according to claim 14,
wherein the other of the source and the drain of each of the first transistor, the third transistor, the fifth transistor, and the eighth transistor is connected to a wiring for supplying high power supply potential, and
wherein the other of the source and the drain of each of the second transistor, the fourth transistor, the seventh transistor, and the tenth transistor is connected to a wiring for supplying low power supply potential.

17. The memory device according to claim 14, wherein the first data is inverted data of the second data.

18. A semiconductor device comprising the memory device according to claim 14.

19. The semiconductor device according to claim 18, further comprising an external device,
wherein the first input terminal is configured to input a first input signal from the external device and to output a first output signal to the external device, and
wherein the second input terminal is configured to input a second input signal from the external device and to output a second output signal to the external device.

20. The semiconductor device according to claim 19,
wherein the external device is configured to output the first input signal and the second input signal to the level shifter at the same time, and
wherein the level shifter is configured to output the first output signal and the second output signal to the external device at the same time.

* * * * *

UNITED STATES PATENT AND TRADEMARK OFFICE
CERTIFICATE OF CORRECTION

PATENT NO.       : 9,105,353 B2
APPLICATION NO.  : 13/473831
DATED            : August 11, 2015
INVENTOR(S)      : Tatsuji Nishijima Page 1 of 1

It is certified that error appears in the above-identified patent and that said Letters Patent is hereby corrected as shown below:

In the Specification:

Column 3, Line 18; Change "be, reduced." to --be reduced.--.

Column 6, Line 52; Change "terminal. X2" to --terminal X2--.

Column 8, Line 7; Change "signal SIB" to --signal S1B--.

Column 8, Line 26; Change "output, terminal" to --output terminal--.

Column 22, Line 1; Change "fog" to --form--.

Column 24, Line 2; Change "below, another" to --below another--.

Column 32, Line 63; Change "funning" to --forming--.

Column 33, Line 21; Change "farmed." to --formed.--.

Column 35, Line 42; Change "channel, $\notin$ represents" to --channel, $\varepsilon$ represents--.

Column 36, Line 26; Change "$\mu_0$" to --$\mu_1$--.

Column 39, Line 6; Change "farmed." to --formed.--.

Column 41, Line 64; Change "20" to --2̶0̶--.

In the Claims:

Column 44, Line 9, Claim 5; Change "claim A," to --claim 4,--.

Signed and Sealed this
Twenty-eighth Day of June, 2016

Michelle K. Lee
*Director of the United States Patent and Trademark Office*